United States Patent
Ohba

(10) Patent No.: US 9,041,091 B2
(45) Date of Patent: May 26, 2015

(54) NONVOLATILE SEMICONDUCTOR MEMORY DEVICE

(71) Applicant: Kabushiki Kaisha Toshiba, Minato-ku (JP)

(72) Inventor: Ryuji Ohba, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 13/957,802

(22) Filed: Aug. 2, 2013

(65) Prior Publication Data

US 2014/0284679 A1    Sep. 25, 2014

Related U.S. Application Data

(60) Provisional application No. 61/804,449, filed on Mar. 22, 2013.

(51) Int. Cl.
| | |
|---|---|
| *H01L 29/788* | (2006.01) |
| *H01L 21/336* | (2006.01) |
| *H01L 29/792* | (2006.01) |
| *H01L 21/28* | (2006.01) |
| *H01L 29/423* | (2006.01) |
| *H01L 29/66* | (2006.01) |
| *H01L 27/115* | (2006.01) |

(52) U.S. Cl.
CPC ........ *H01L 29/792* (2013.01); *H01L 21/28273* (2013.01); *H01L 21/28282* (2013.01); *H01L 29/42324* (2013.01); *H01L 29/66825* (2013.01); *H01L 29/7881* (2013.01); *H01L 27/11521* (2013.01); *H01L 27/11568* (2013.01)

(58) Field of Classification Search
USPC .......................... 438/257–267; 257/315–320, 257/E29.134–E29.161
See application file for complete search history.

(56) References Cited

U.S. PATENT DOCUMENTS

| | | | | |
|---|---|---|---|---|
| 7,109,549 | B2 * | 9/2006 | Ozawa | 257/315 |
| 7,595,522 | B2 * | 9/2009 | Takeuchi | 257/298 |
| 8,212,303 | B2 * | 7/2012 | Sakamoto | 257/314 |
| 8,212,308 | B2 * | 7/2012 | Nishihara et al. | 257/321 |
| 2006/0237754 | A1 | 10/2006 | Ishida | |
| 2007/0290274 | A1 | 12/2007 | Yaegashi | |
| 2008/0105916 | A1 * | 5/2008 | Watanabe | 257/315 |
| 2011/0024824 | A1 | 2/2011 | Shimura et al. | |
| 2011/0309429 | A1 | 12/2011 | Kiyotoshi | |
| 2013/0248967 | A1 | 9/2013 | Ohba | |

FOREIGN PATENT DOCUMENTS

| | | |
|---|---|---|
| JP | 2006-303308 | 11/2006 |
| JP | 2008-4622 | 1/2008 |
| JP | 2011-29513 | 2/2011 |

(Continued)

*Primary Examiner* — Calvin Lee
(74) *Attorney, Agent, or Firm* — Oblon, McClelland, Maier & Neustadt, L.L.P.

(57) ABSTRACT

According to one embodiment, a device includes a fin type active area on a semiconductor substrate, the active area having an upper surface with a taper shape, having a width in a first direction, and extending in a second direction intersect with the first direction, a first insulating layer on the active area, a charge storage layer on the first insulating layer, the charge storage layer having an upper surface with a taper shape, a second insulating layer covering the upper surface of the charge storage layer, and a control gate electrode on the second insulating layer, the control gate electrode extending in the first direction.

20 Claims, 21 Drawing Sheets

(56) References Cited

FOREIGN PATENT DOCUMENTS

| JP | 2012-4304 | 1/2012 |
| JP | 2013-201257 | 10/2013 |
| JP | 2013-201264 | 10/2013 |

\* cited by examiner

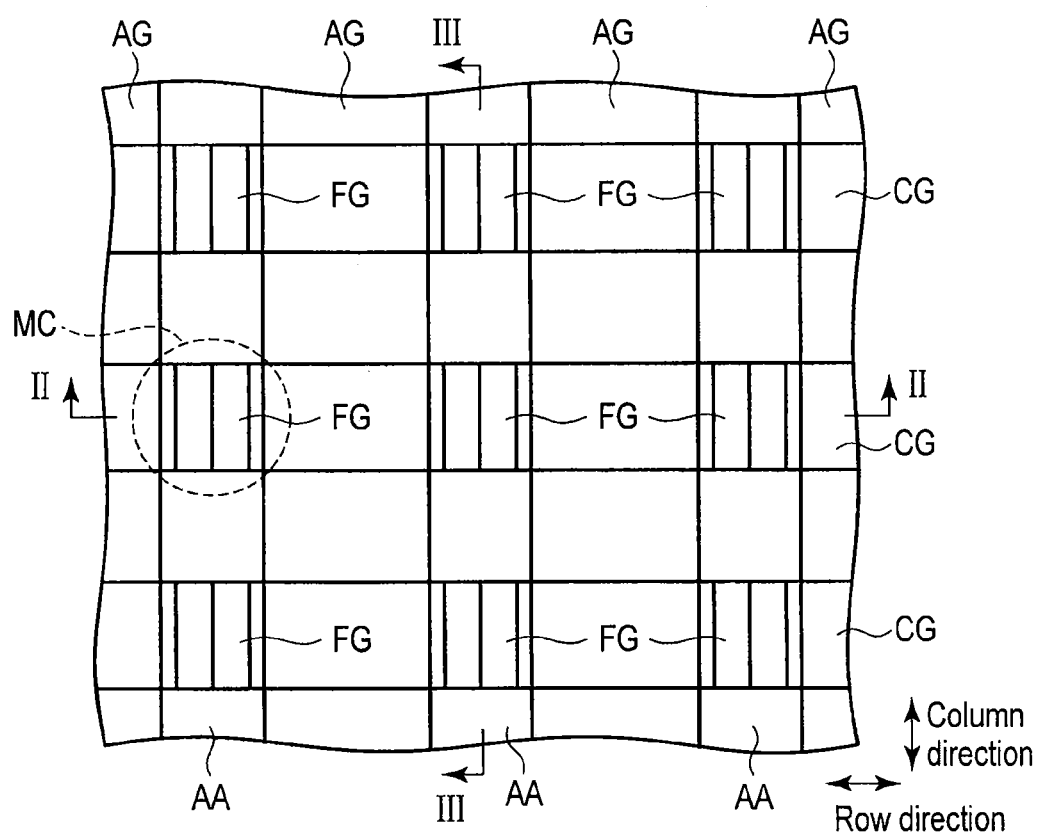
F I G. 1

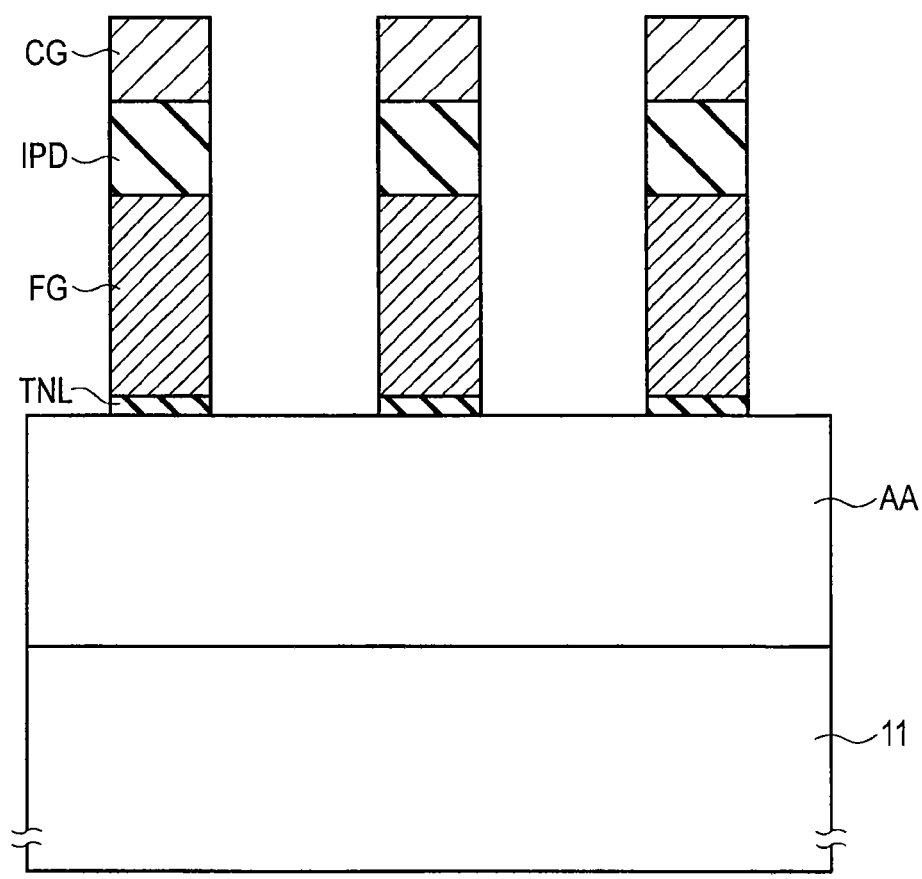
F I G. 3

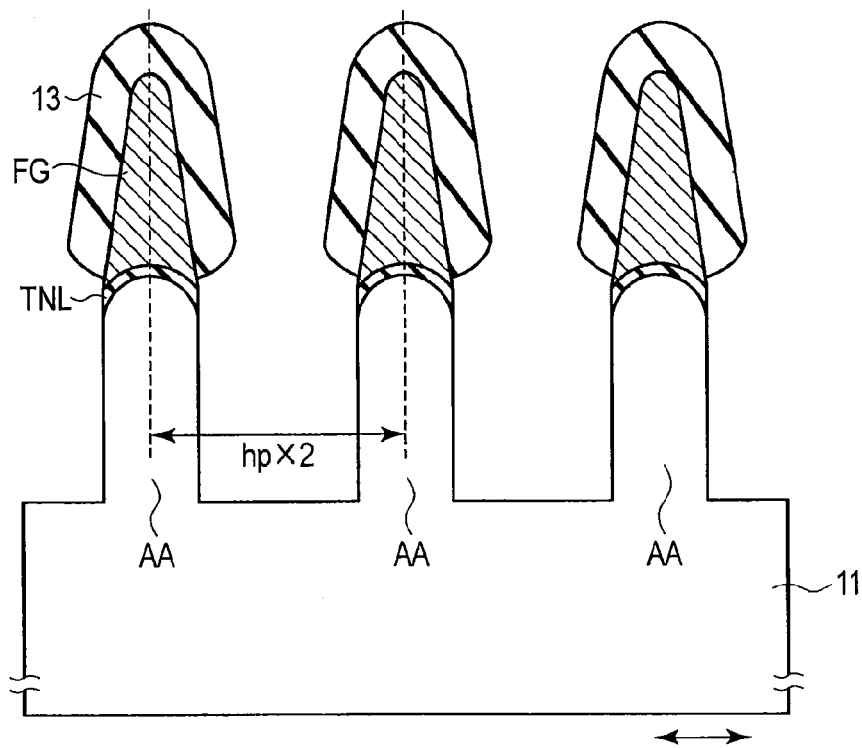
F I G. 1 2
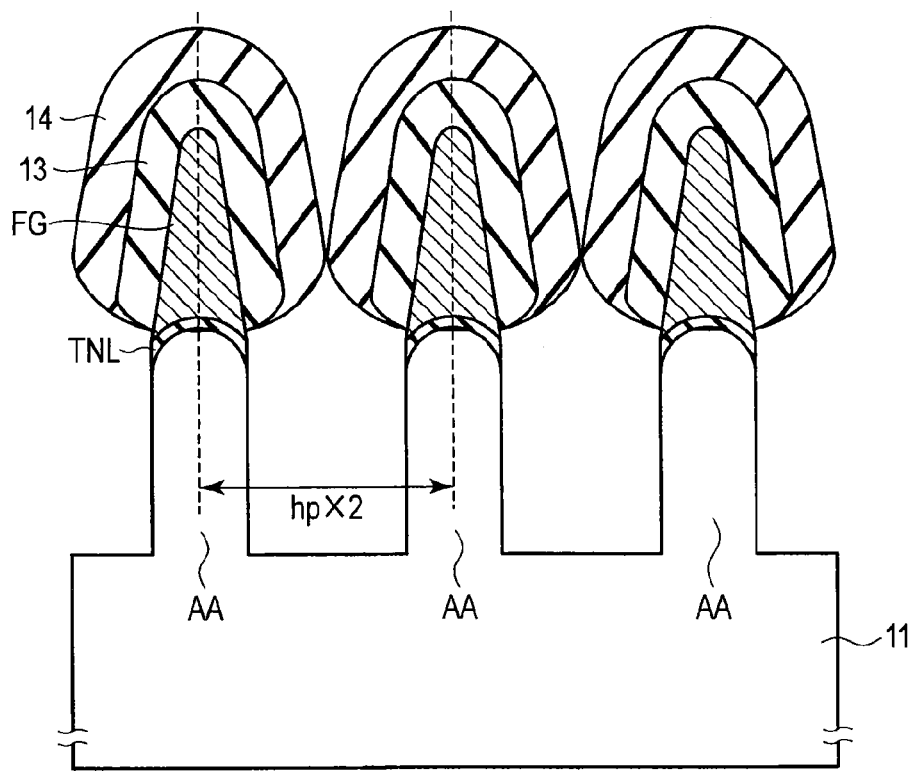
F I G. 1 3

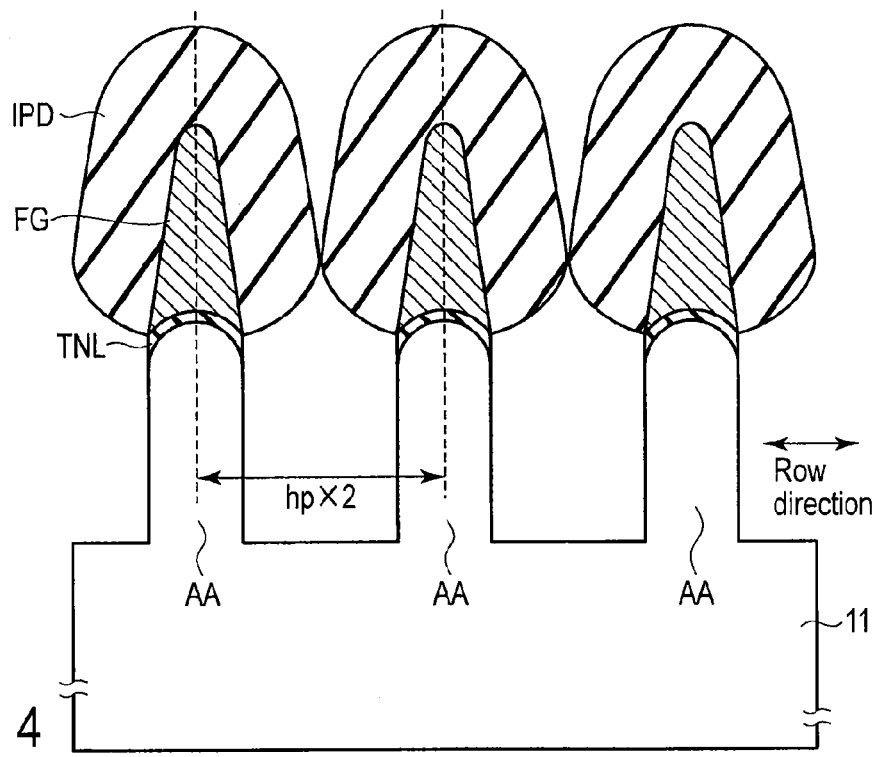
F I G. 14
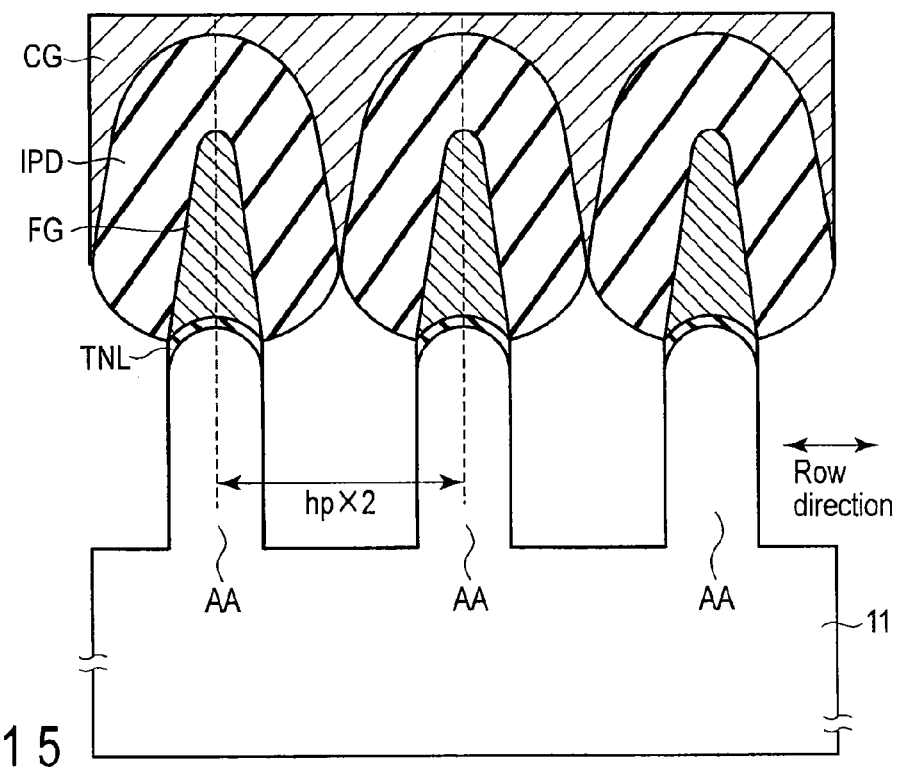
F I G. 15

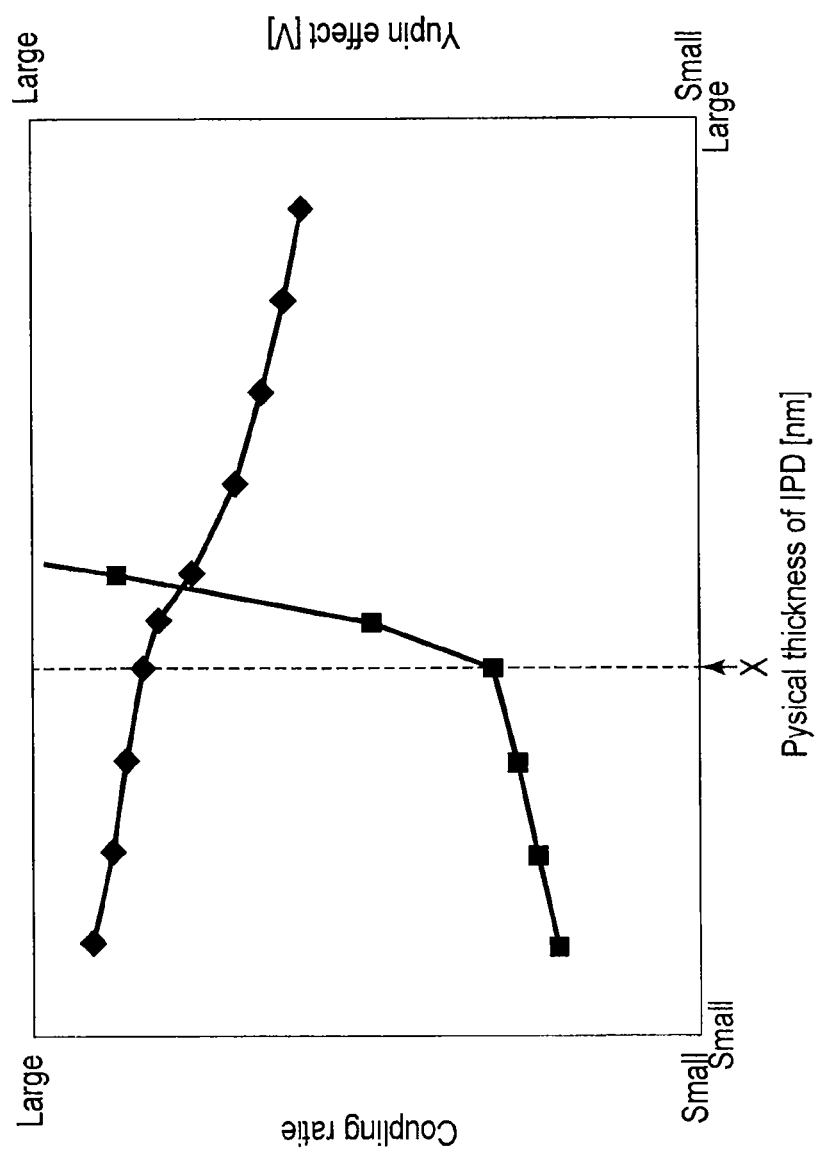
F I G. 16

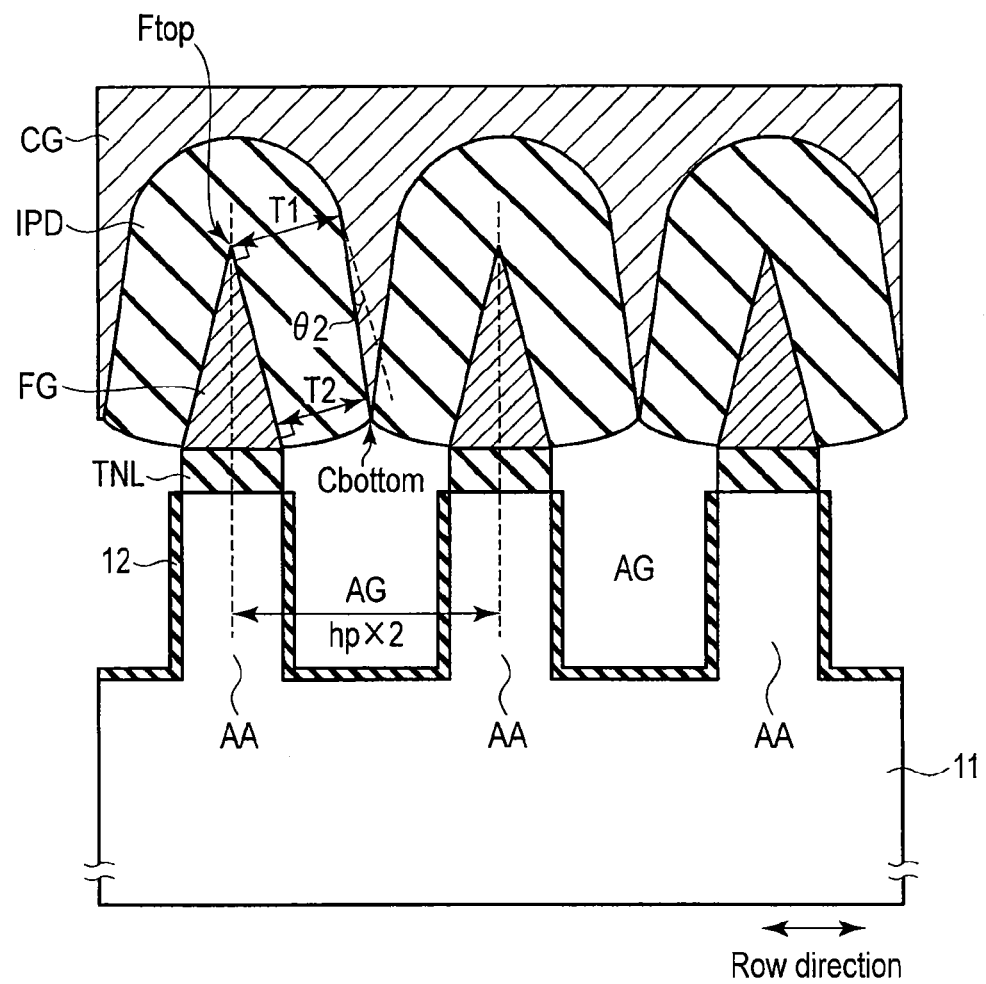
F I G. 22

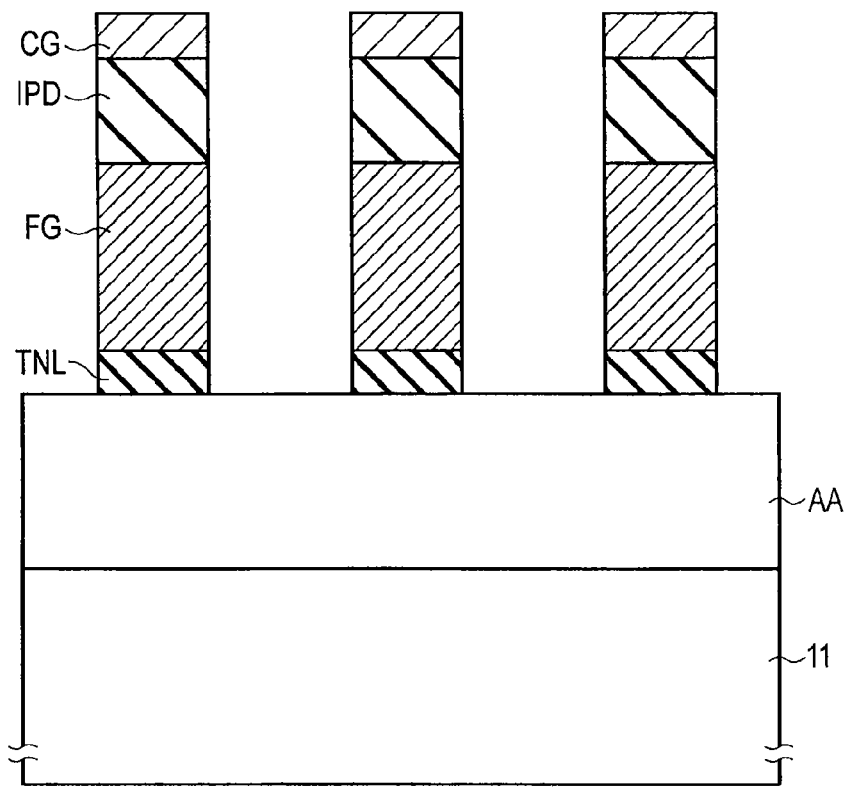
F I G. 23
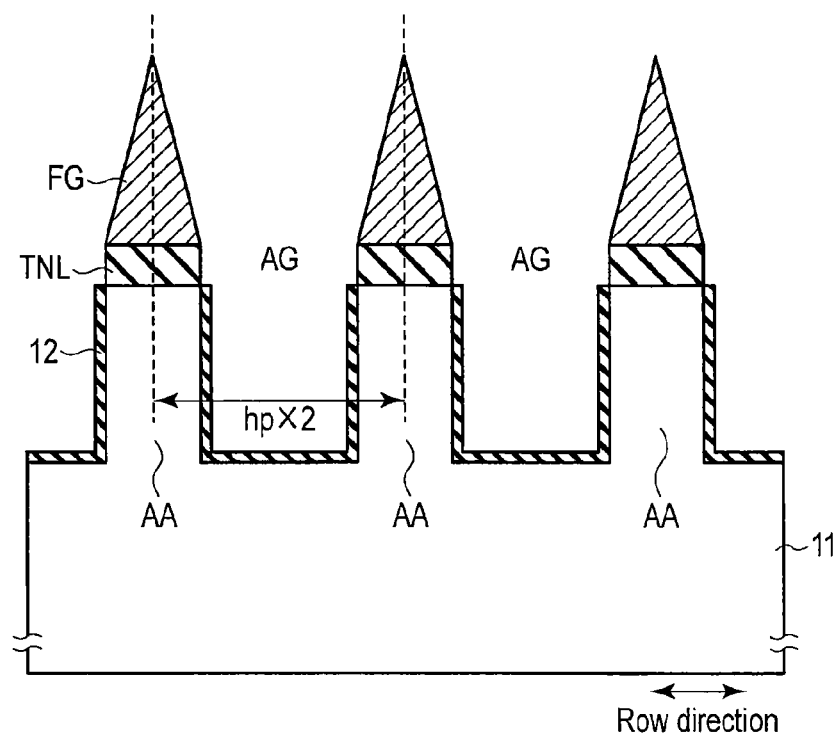
F I G. 24

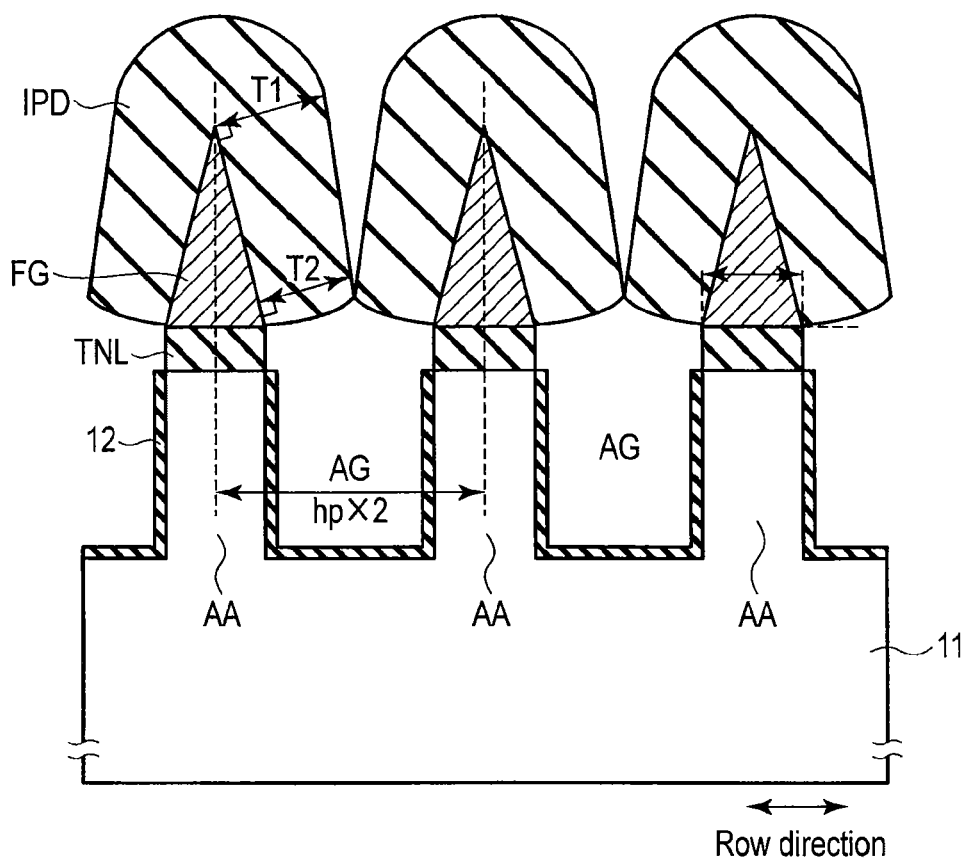
F I G. 2 5

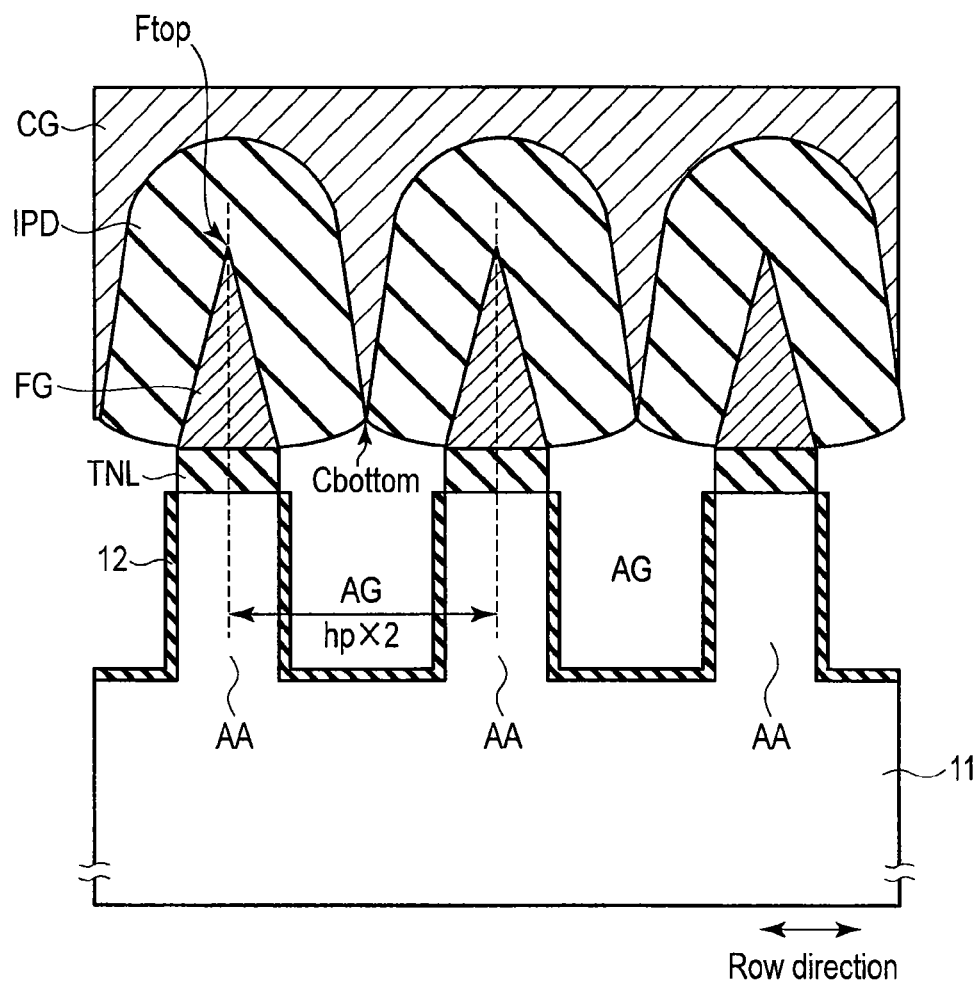
F I G. 2 6

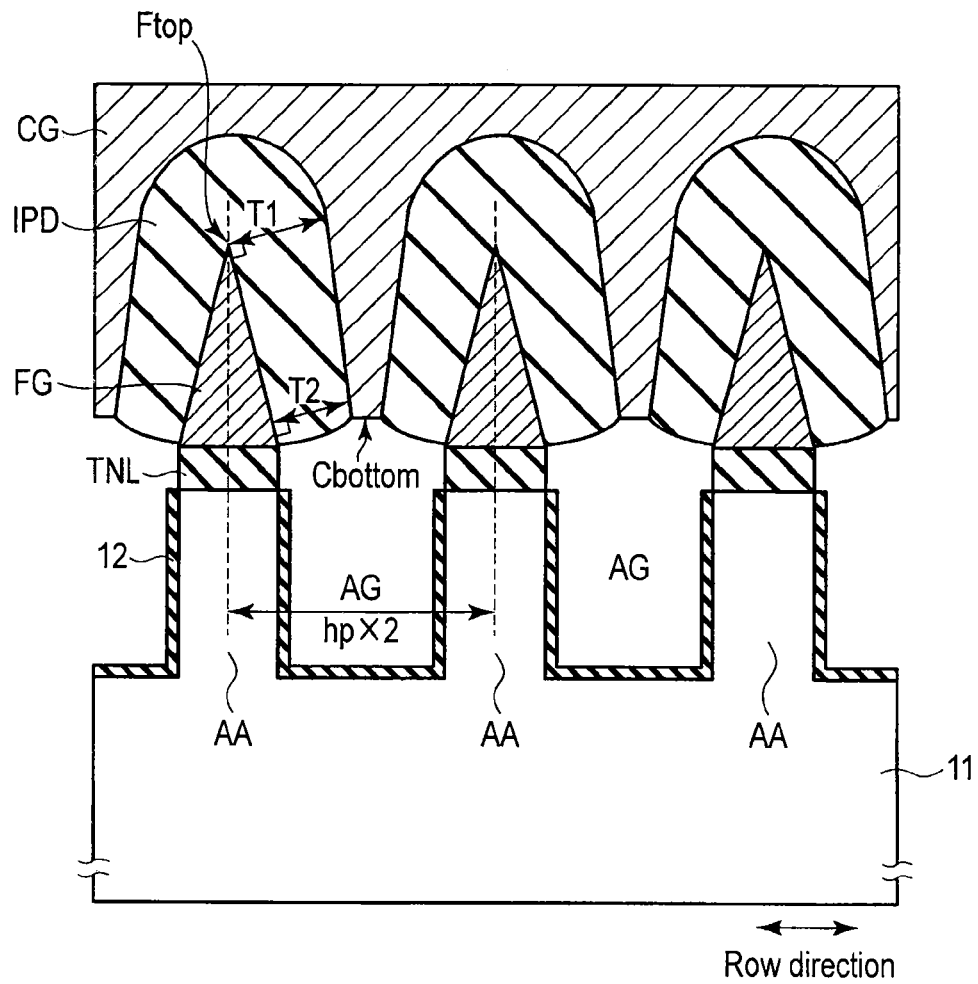
F I G. 27

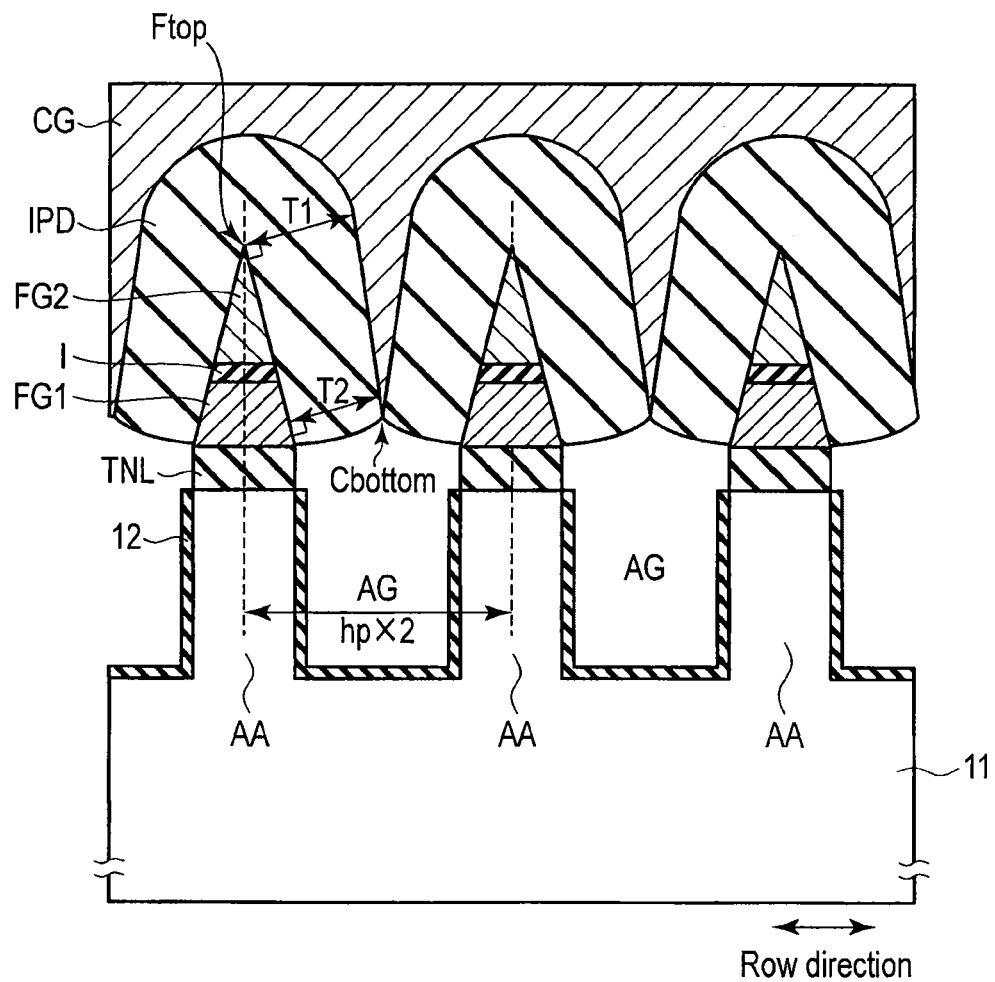
F I G. 28

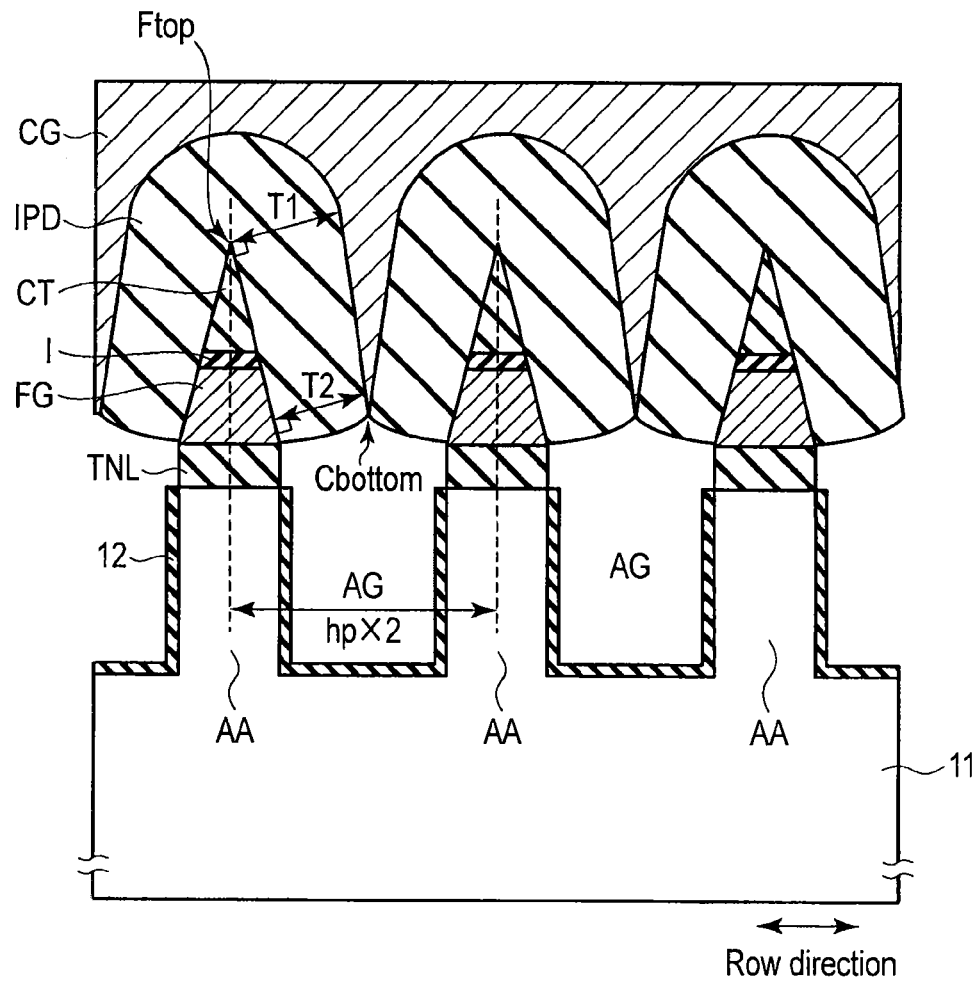
F I G. 29

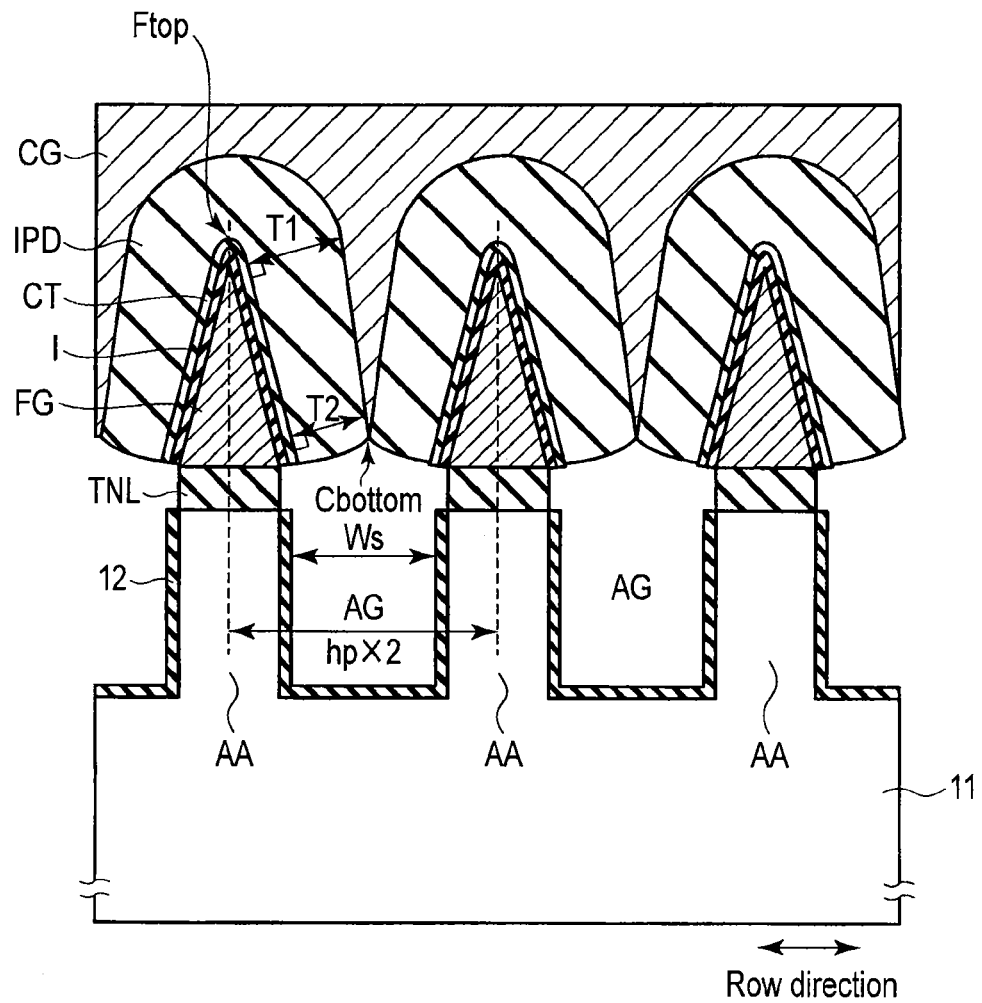
F I G. 30

NONVOLATILE SEMICONDUCTOR MEMORY DEVICE

CROSS-REFERENCE TO RELATED APPLICATIONS

This application claims the benefit of U.S. Provisional Application No. 61/804,449, filed Mar. 22, 2013, the entire contents of which are incorporated herein by reference.

FIELD

Embodiments described herein relate generally to a nonvolatile semiconductor memory device.

BACKGROUND

In nonvolatile semiconductor memory devices such as a NAND flash memory, a flat cell structure advantageous to miniaturization has been again attracting attention in recent years.

An advantage of the flat cell structure is that an inter-gate insulating layer and a control gate electrode do not intervene between floating gate electrodes arranged in a row direction in which the control gate electrode (word line) extends, and therefore do not limit half of the pitch (half pitch) of bit lines extending in a column direction.

However, in the flat cell structure, the area in which the floating gate electrodes and the control gate electrode face each other is small, and a sufficient coupling ratio is not easily obtained. If the half pitch is narrowed by the flat cell structure, there will be a problem known as inter-cell interference in which memory cells arranged in the row direction interfere with one another in read and write operations.

BRIEF DESCRIPTION OF THE DRAWINGS

FIG. 1 is a plan view showing a first embodiment of an array structure;

FIG. 3 is a sectional view taken along the line III-III in FIG. 1;

FIG. 5 to FIG. 15 are sectional views showing an example of a manufacturing method;

FIG. 16 is a graph showing the dependence of a coupling ratio and inter-cell interference on the thickness of an inter-electrode insulating layer;

FIG. 22 is a sectional view taken along the line XXII-XXII in FIG. 21;

FIG. 23 is a sectional view taken along the line XXIII-XXIII in FIG. 21;

FIG. 24 to FIG. 26 are sectional views showing an example of a manufacturing method; and FIG. 27 to FIG. 30 are sectional views showing modifications of the device structure in FIG. 22.

DETAILED DESCRIPTION

In general, according to one embodiment, a nonvolatile semiconductor memory device comprises: a semiconductor substrate; a fin type active area on the semiconductor substrate, the active area having an upper surface with a taper shape, having a width in a first direction, and extending in a second direction intersect with the first direction; a first insulating layer on the active area; a charge storage layer on the first insulating layer, the charge storage layer having an upper surface with a taper shape; a second insulating layer covering the upper surface of the charge storage layer; and a control gate electrode on the second insulating layer, the control gate electrode extending in the first direction.

Hereinafter, an embodiment will be described with reference to the drawings.

1. First Embodiment

[Structure]

Figure 2:
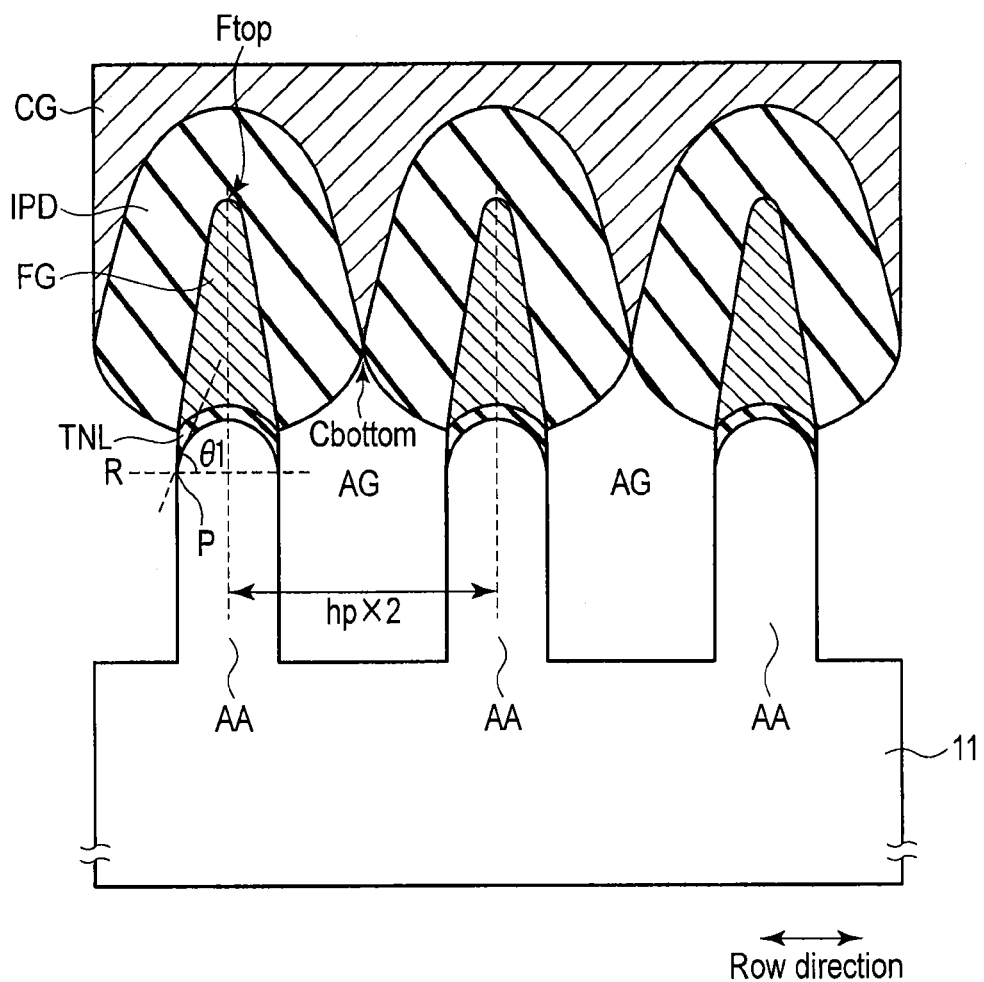
FIG. 2 is a sectional view taken along the line II-II in FIG. 1.

FIG. 1 to FIG. 3 show a first embodiment of an array structure.

FIG. 1 is a plan view of a memory cell array. FIG. 2 is a sectional view taken along the line II-II in FIG. 1. FIG. 3 is a sectional view taken along the line III-III in FIG. 1.

A semiconductor substrate 11 is, for example, a silicon substrate. The upper surface of the semiconductor substrate 11 is shaped to have depressions and projections. The projections constitute fin type active areas AA. The fin type active areas AA are arranged in a row direction (first direction), and extend in a column direction (second direction) that intersects with the row direction.

The width of the upper surfaces of the fin type active areas (projections) AA in the row direction gradually becomes smaller upward. That is, the upper surfaces of the fin type active areas AA have taper shapes. For example, the upper surfaces of the fin type active areas AA have convex curves.

At a start point P of the taper shape (e.g. convex curve), an angle θ1 between the taper shape and reference plane parallel to the surface of the semiconductor substrate 11 is, for example, 30 degrees or more and 60 degrees or less. The angle θ1 is preferably about 45 degrees.

The upper surface (the bottoms of the depressions) of the semiconductor substrate 11 and the side surfaces of the fin type active areas AA may be covered with an insulating layer. The insulating layer is, for example, an oxide layer formed by the oxidizing of the semiconductor substrate 11. The insulating layer prevents electrons in the fin type active areas (channels) AA from escaping to an air gap AG.

The fin type active areas AA are a part of the semiconductor substrate 11 in this example, but are not limited thereto. For example, the fin type active areas AA may be semiconductor layers such as epitaxial layers on the semiconductor substrate 11.

Memory cells (field effect transistors: FET) MC are arranged on each of the fin type active areas AA. The memory cells MC on one fin type active area AA are connected in series, for example, in the column direction, and thereby constitute a NAND string.

Each of the memory cells MC includes a gate insulating layer (tunnel insulating layer) TNL on the fin type active area AA, a floating gate electrode FG on the gate insulating layer TNL, an inter-electrode insulating layer IPD on the floating gate electrode FG, and a control gate electrode CG on the inter-electrode insulating layer IPD.

The gate insulating layer TNL is, for example, an oxide silicon layer, and is formed by the oxidizing of the upper surface of the fin type active area AA. When the upper surfaces of the fin type active areas AA have, for example, convex curves, the upper surface of the gate insulating layer TNL has a convex curve, and the lower surface of the gate insulating layer TNL has a concave curve.

The floating gate electrode FG is, for example, an electrically floating polysilicon layer or metallic layer, or a stack of these layers. The width of the floating gate electrode FG in the row direction gradually becomes smaller upward. That is, the floating gate electrode FG has a taper shape.

The floating gate electrode FG is in a triangular shape having a rounded vertex in this example, but is not limited thereto. For example, the floating gate electrode FG may be, for example, trapezoidal or semicircular.

Thus, the shape of the floating gate electrode FG is tapered upward, so that inter-cell interference can be lessened.

The side surface of the floating gate electrode FG in the row direction may be covered with an insulating layer such as an oxide layer. In this case, the insulating layer covering the side surface of the floating gate electrode FG in the row direction prevents electrons stored in the floating gate electrode FG from escaping to the air gap AG.

The inter-electrode insulating layer IPD covers the floating gate electrode FG. Two inter-electrode insulating layers IPD of two memory cells MC adjacent in the row direction are in contact with each other. Two inter-electrode insulating layers IPD may be in point contact or line contact (finite width). Therefore, a space between the fin type active areas AA is the air gap AG.

The inter-electrode insulating layer IPD comprises, for example, a high-dielectric-constant material having a dielectric constant higher than that of a silicon oxide layer to improve the coupling ratio of the memory cell. The high-dielectric-constant material is a metal oxide such as $Al_2O_3$, $ZrO_2$, $HfO_2$, HfSiO, HfAlO, LaAlO(LAO), or LaAlSiO (LASO), or is a stack structure of these metal oxides. The high-dielectric-constant material may be a stack structure of a silicon oxide layer and a silicon nitride layer, such as ONO.

When the floating gate electrode FG and the control gate electrode CG include polysilicon layers, the inter-electrode insulating layer IPD may be called an inter-polysilicon dielectric (IPD).

The control gate electrode CG comprises a polysilicon layer and a metallic silicide layer, or a stack structure of these layers. The control gate electrode CG and the inter-electrode insulating layer IPD extend in the row direction. The control gate electrode CG constitutes a word line.

In the array structure described above, the control gate electrode CG has a bottom Cbottom in a part contacting two inter-electrode insulating layers IPD. The bottom Cbottom of the control gate electrode CG is lower than a top Ftop of the floating gate electrode FG.

Therefore, according to this example, the inter-electrode insulating layer IPD and the control gate electrode CG can be partly inserted between two floating gate electrodes FG. As a result, the part in which the floating gate electrode FG and the control gate electrode CG face each other increases, so that the coupling ratio of the memory cells MC can be improved.

However, in the structure according to this example, the coupling ratio of the memory cells MC may be excessively high in some cases. Thus, in view of these circumstances, the upper surfaces of the fin type active areas AA are, for example, convex curves. That is, if the curvature of the convex curve is changed, the area in which the active area AA and the floating gate electrode FG face each other can be adjusted regarding one memory cell MC.

Consequently, the coupling ratio of the memory cells MC can be set to an optimum value.

As in the case with a flat cell structure, the array structure can maintain an advantageous effect of a half pitch hp that is not limited by the inter-electrode insulating layer IPD and the control gate electrode CG. However, the half pitch hp corresponds to half of the pitch of an unshown bit line disposed on the top of the active area AA.

The space between the floating gate electrodes FG is the air gap AG in this example, but can be replaced by an insulating layer (e.g. silicon oxide layer) lower in relative dielectric constant than the inter-electrode insulating layer IPD. Moreover, a charge storage layer of the memory cell MC is the floating gate electrode FG in this example, but can be replaced by a charge trap layer (insulating layer) having a charge trap function.

In this example, the memory cells MC arranged in the column direction do not have any diffusion layers in the fin type active area AA. This is because what is known as a fringe effect permits a channel to be formed in the fin type active area AA without the diffusion layers if each of the memory cells MC is miniaturized.

However, each of the memory cells MC may have a diffusion layer in the fin type active area AA.

Figure 4:
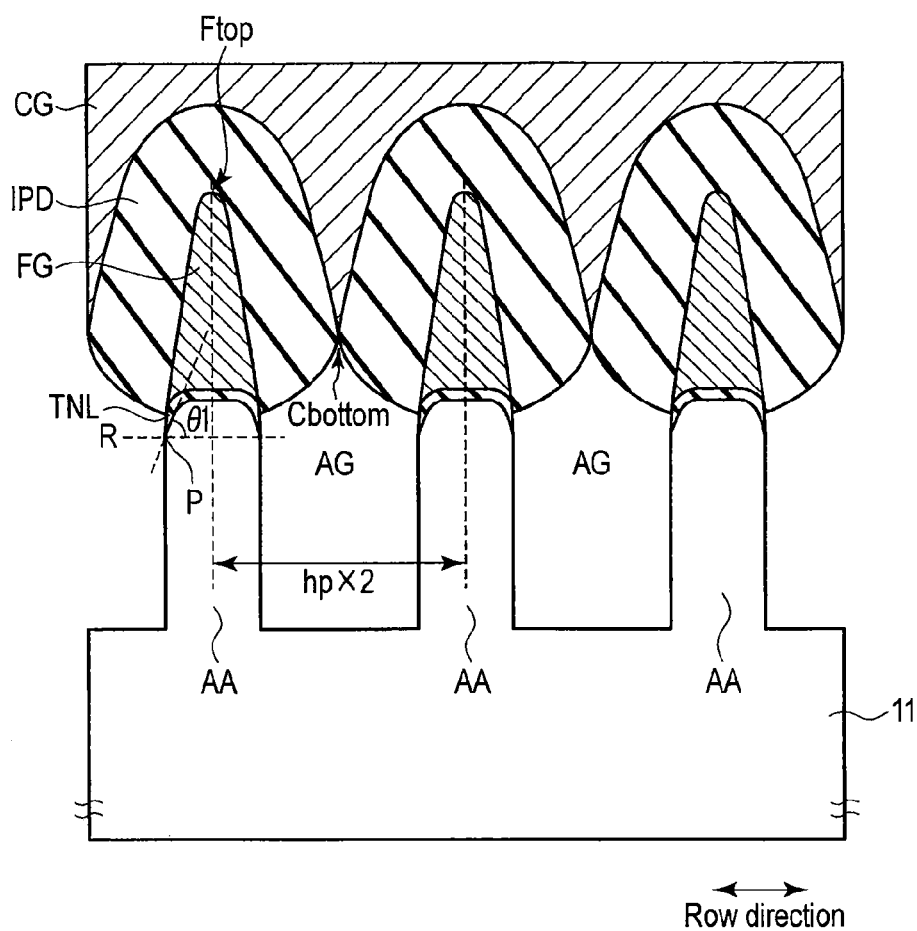
FIG. 4 is a sectional view showing a modification of a device structure in FIG. 2.

Although the upper surfaces of the fin type active areas AA are convex curves in the array structure described above, the upper surfaces of the fin type active areas AA have only to be in a taper shape that gradually becomes smaller upward. The taper shape include, for example, a trapezoidal shape (including a trapezoidal shape having rounded edges) shown in FIG. 4, and a triangular shape (including a triangular shape having rounded edges).

The array structure according to this example simultaneously enables the increase of the coupling ratio and the prevention of the inter-cell interference in the flat cell structure. Moreover, the coupling ratio of the memory cells can be easily adjusted to an optimum value.

[Manufacturing Method]

A manufacturing method of the array structure according to the embodiment is described.

Figure 5:
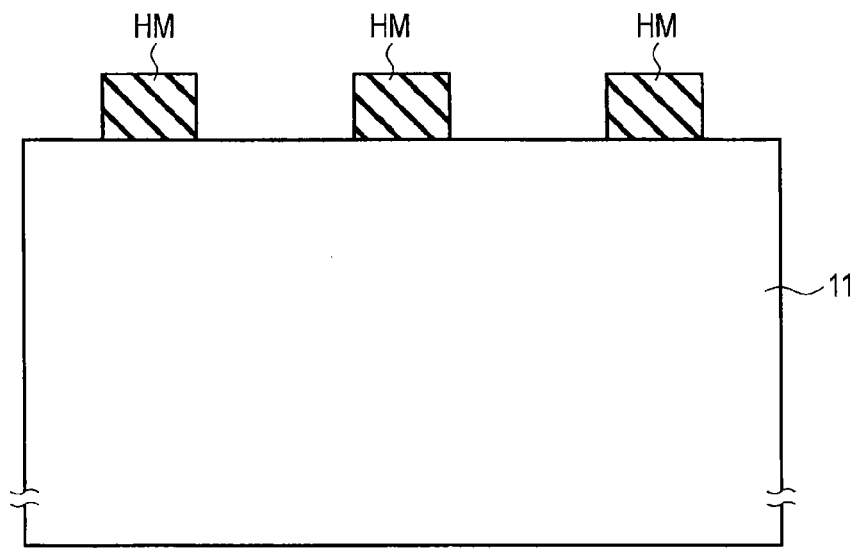
Figure 6:
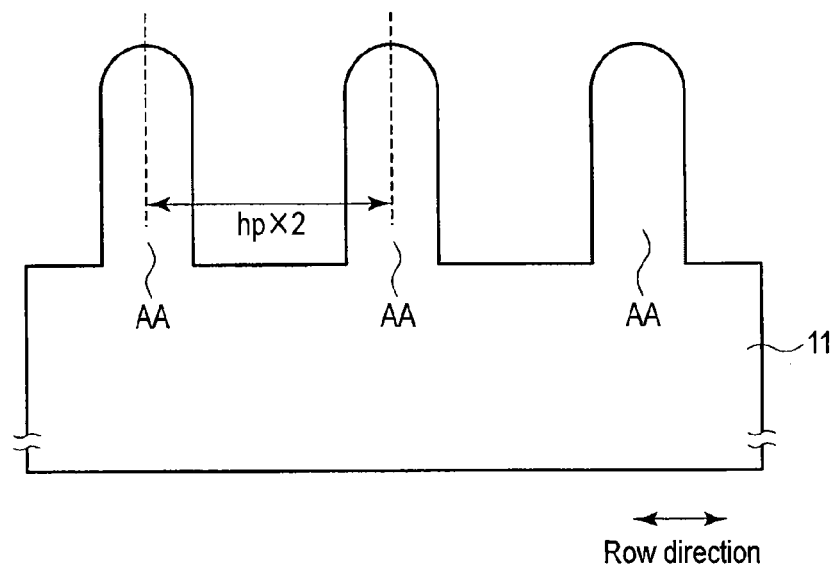

First, as shown in FIG. 5, a hard mask layer HM having line-and-space patterns is formed on a semiconductor substrate 11. This hard mask layer HM is used as a mask to etch the semiconductor substrate 11, for example, by dry etching. As a result, the semiconductor substrate 11 with an upper surface shaped to have depressions and projections is formed, as shown in FIG. 6.

The projections of the semiconductor substrate 11 have a width in the row direction, and function as fin type active areas AA extending in the column direction. The upper surfaces of the fin type active areas AA have taper shapes, for example, convex curves.

Figure 7:
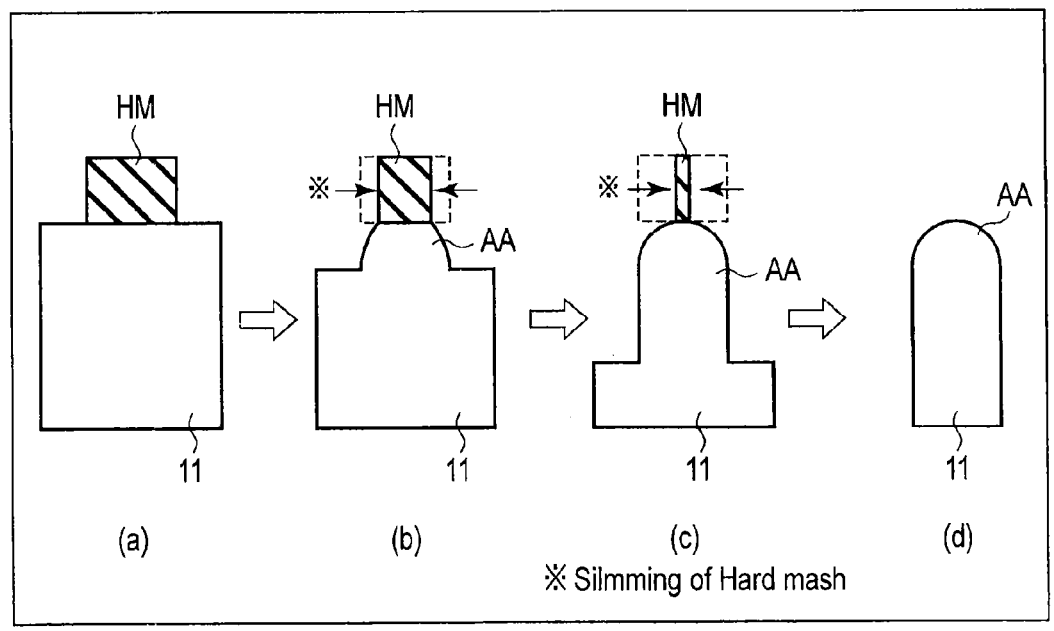

Here, how the upper surface of the fin type active area AA is formed into the taper shape is described. As shown in FIG. 7, in order to form the upper surfaces of the fin type active areas AA into the taper shapes, the retreat rate (rate of slimming) of the hard mask layer HM, for example, by the dry etching can be adjusted.

For example, when SiON is used as the hard mask layer HM, the ratio of oxygen (O) in the hard mask layer HM can be controlled to control the retreat rate of the hard mask layer HM. That is, in general, the retreat rate of the hard mask layer HM is higher when the ratio of O in SiON is higher, whereas the retreat rate of the hard mask layer HM is lower when the ratio of O in SiON is lower.

In a step (b) of FIG. 7, the edges of the tops of the fin type active areas AA are rounded by the slimming of the hard mask layer HM.

In a step (c) of FIG. 7, patterning of the fin type active areas AA is almost finished. However, as the hard mask layer HM remains on the fin type active areas AA, parts of the upper surfaces of the fin type active areas that are covered with the hard mask layer HM are flat. In this step (c), a device structure in FIG. 4, for example, is completed in the end after the patterning of the fin type active areas AA is almost finished.

In a step (d) of FIG. 7, the hard mask layer HM is completely removed, for example, during the dry etching. In this case, a device structure in FIG. 2, for example, is completed in the end.

Figure 8:
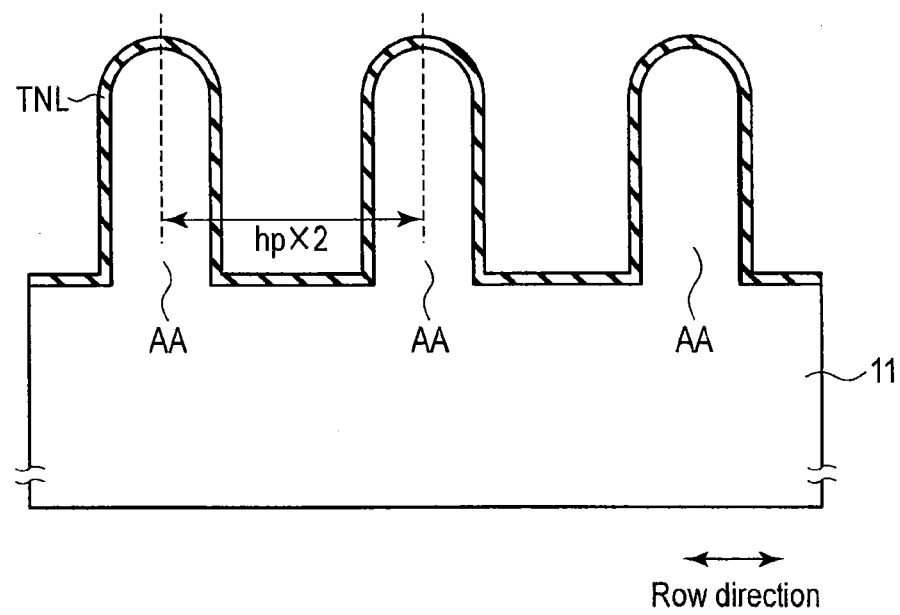

As shown in FIG. 8, a gate insulating layer (tunnel insulating layer) TNL is then formed on the semiconductor substrate 11 and the surface (upper surface) of the fin type active area AA, for example, by thermal oxidation. At the top of the fin type active area AA, the upper surface of the gate insulating layer TNL has a convex curve, and the lower surface of the gate insulating layer TNL has a concave curve.

Figure 9:
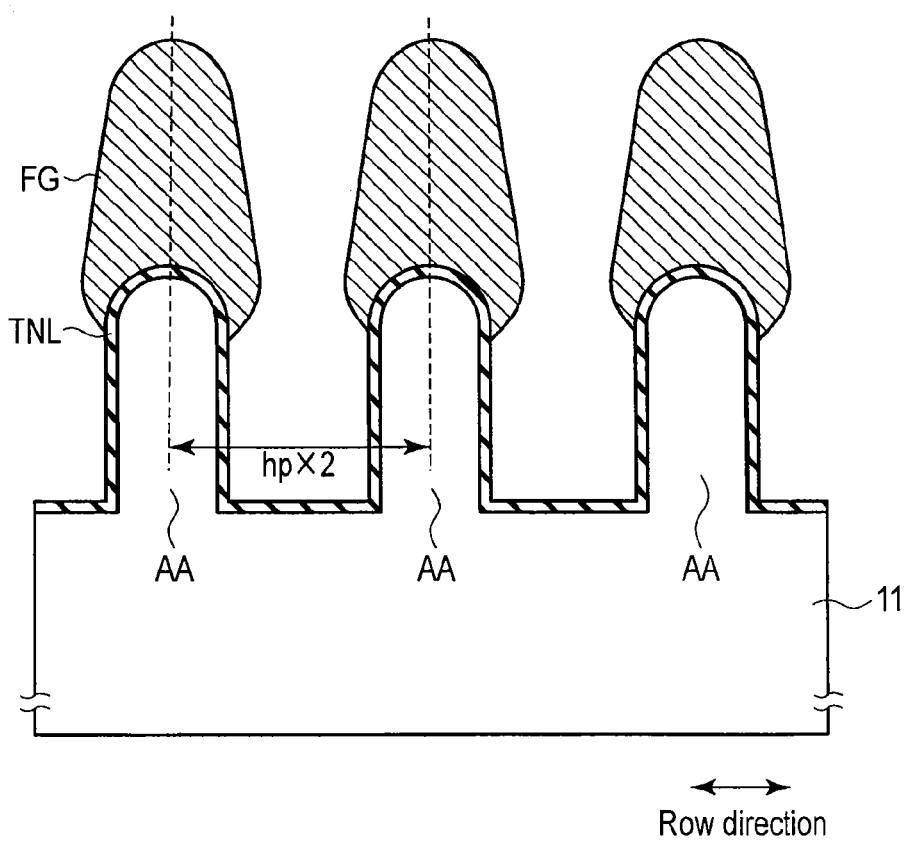

As shown in FIG. 9, a floating gate electrode FG is then formed on the gate insulating layer TNL at the top of the fin type active area AA. The floating gate electrode FG is, for example, a polysilicon layer. Here, the floating gate electrode FG is formed at the top of the fin type active area AA by the use of a deposition method such as a sputtering method or a CVD method that deteriorates the coverage of the polysilicon layer.

Figure 10:
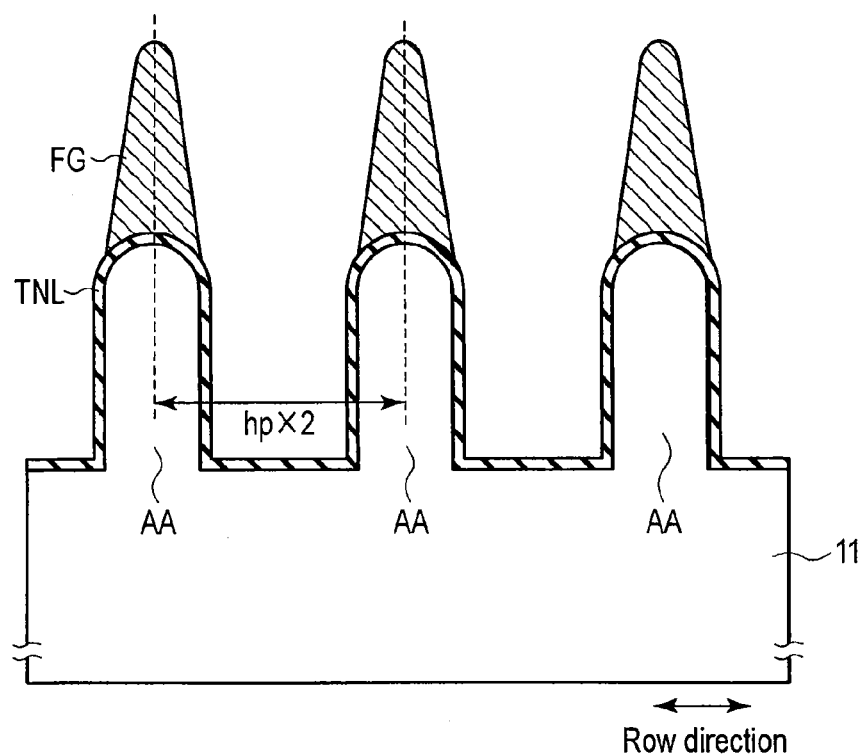

As shown in FIG. 10, the floating gate electrode FG is then isotropically etched to narrow the width of the floating gate electrode FG in the row direction (slimming). As a result, the floating gate electrode FG is formed into a taper shape. That is, the width of the floating gate electrode FG in the row direction gradually becomes smaller upward.

Figure 11:
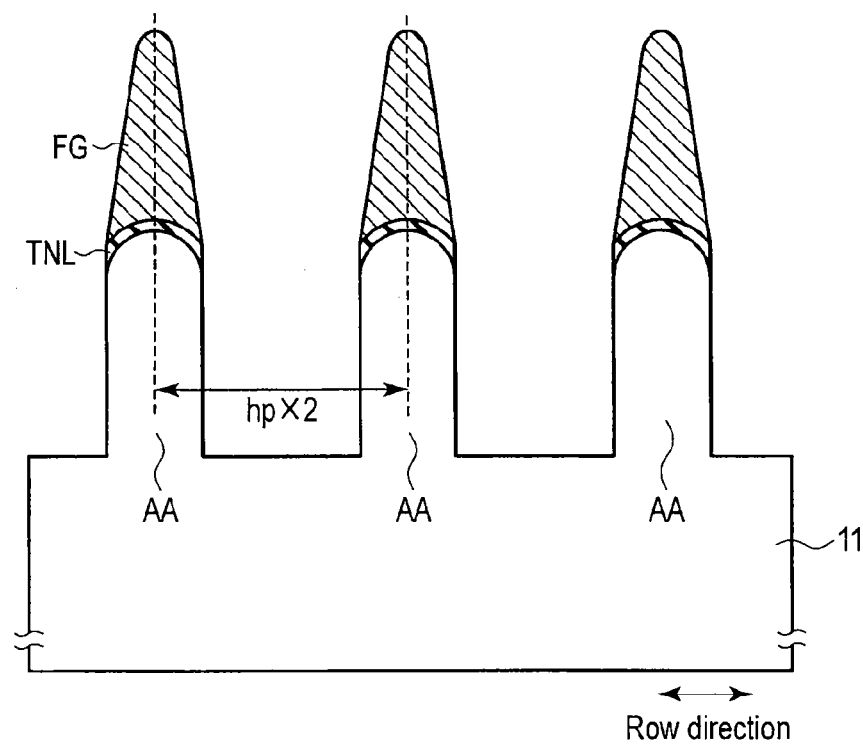

When the gate insulating layer TNL that is not covered with the floating gate electrode FG is removed, a structure shown in FIG. 11 is obtained. However, this step may be omitted, and the gate insulating layer TNL that is not covered with the floating gate electrode FG may be left.

As shown in FIG. 12, an insulating layer (e.g. silicon oxide layer) 13 is then formed on the upper surface of the floating gate electrode FG. As shown in FIG. 13, an insulating layer (e.g. lanthanum aluminate layer) 14 is then formed on the insulating layer 13.

Here, the two insulating layers 13 and 14 are formed at the top of the fin type active area AA by the use of a deposition method such as the sputtering method or the CVD method that deteriorates the coverage of the silicon oxide layer or the lanthanum aluminate layer.

The two insulating layers 13 and 14 are then caused to react to each other, for example, by a thermal treatment, and one insulating layer (e.g. lanthanum aluminum silicate layer) as an inter-electrode insulating layer IPD is formed, as shown in FIG. 14.

In this example, the inter-electrode insulating layer IPD is formed by the steps in FIG. 12 to FIG. 14. Alternatively, the inter-electrode insulating layer IPD may be formed directly on the upper surface of the floating gate electrode FG.

Finally, as shown in FIG. 15, a control gate electrode CG is formed on the inter-electrode insulating layer IPD. The control gate electrode CG is formed, for example, by the following process.

An electrode material is formed on the inter-electrode insulating layer IPD, and a mask layer is formed on the electrode material. The mask layer has line-and-space patterns which are arranged with a constant pitch in the column direction and which extend in the row direction.

The mask layer is used as a mask to pattern the electrode material and the inter-electrode insulating layer IPD by RIE. At the same time, the floating gate electrodes FG present in regions that are not covered with the mask layer are also etched.

That is, the floating gate electrodes FG of the memory cells that are connected in series in the column direction are separated from one another.

Although the control gate electrode CG completely fills a narrow part of the space between two inter-electrode insulating layers IPD in FIG. 15, an air gap (void) or the like may be formed in a part of the space between two inter-electrode insulating layers IPD. However, in order to obtain the advantageous effects described in the present specification, the Ftop needs to be higher than the Cbottom.

The cell array structure according to the first embodiment is completed by the manufacturing method described above.

[Adjustment of Coupling Ratio]

FIG. 16 shows the relation of the coupling ratio and the inter-cell interference to the thickness of the inter-electrode insulating layer.

In FIG. 16, ♦ indicates the relation between the coupling ratio and the physical thickness of the inter-electrode insulating layer, and ■ indicates the relation between the inter-cell interference (Yupin effect) and the physical thickness of the inter-electrode insulating layer IPD.

According to FIG. 16, the coupling ratio rapidly drops when the physical thickness of the inter-electrode insulating layer IPD is beyond X1. This is conceivably attributed to the fact that the position of the bottom Cbottom of the control gate electrode CG in FIG. 2 is higher, for example, if the thickness of the part where two inter-electrode insulating layers IPD contact is larger. Here, X1 is the thickness at which the two adjacent inter-electrode insulating layers IPD start contacting, that is, come into point contact.

When the physical thickness of the inter-electrode insulating layer IPD is beyond X1, the inter-cell interference (Yupin effect) rapidly increases. This is conceivably attributed to the disappearance of the air gap between two inter-electrode insulating layers IPD when coming into contact.

Here, the coupling ratio can be extremely high in the structure according to this example. For example, if a material including an oxide such as La, Hf, or Al is used as the inter-electrode insulating layer IPD, the equivalent oxide thickness (EOT) of the inter-electrode insulating layer IPD is 1.5 nm or less, and the coupling ratio can reach a value of more than 0.8.

However, if the coupling ratio is beyond 0.8, disturbance in a reading increases, and the characteristics of the memory cells may deteriorate. To prevent this, it is necessary to reduce the gate insulating layer TNL in thickness and adjust the coupling ratio. However, the thickness reduction of the gate insulating layer TNL is limited.

In contrast, according to this example, the coupling ratio can be adjusted by the increase of the area in which the active area and the charge storage layer face each other, so that the thickness reduction of the gate insulating layer TNL is not needed. However, it goes without saying that the coupling ratio may be adjusted by the structure according to this example (e.g. the formation of the upper surface of the active area into a curved surface) and by the thickness of the gate insulating layer TNL.

[First Modification]

Figure 17:
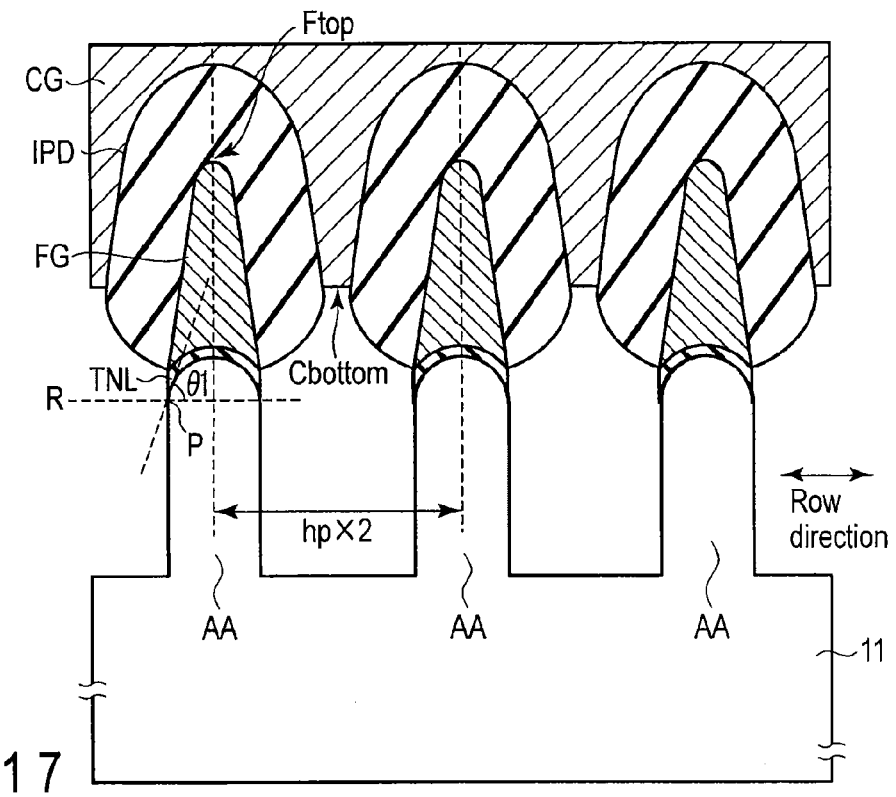
FIG. 17 to FIG. 20 are sectional views showing modifications of the device structure in FIG. 2.

FIG. 17 shows a cell array structure according to a first modification.

FIG. 17 corresponds to the sectional view (FIG. 2) in the row direction according to the first embodiment described above.

The cell array structure according to this example is different from the cell array structure according to the first embodiment described above in that an opening is formed between two inter-electrode insulating layers IPD of two memory cells adjacent in the row direction so that these inter-electrode insulating layers IPD are separated from each other.

As the control gate electrode CG is formed by a deposition method such as a sputtering method or a CVD method that deteriorates the coverage, the control gate electrode CG is not formed on the semiconductor substrate 11 through the opening between two inter-electrode insulating layers IPD.

In this example as well, the bottom Cbottom of the control gate electrode CG is lower than the top Ftop of the floating gate electrode FG. The upper surfaces of the fin type active areas AA have taper shapes.

In this example as well, it is possible to obtain advantageous effects such as the increase of the coupling ratio, the prevention of the inter-cell interference, and easier adjustment of the coupling ratio.

[Second Modification]

Figure 18:
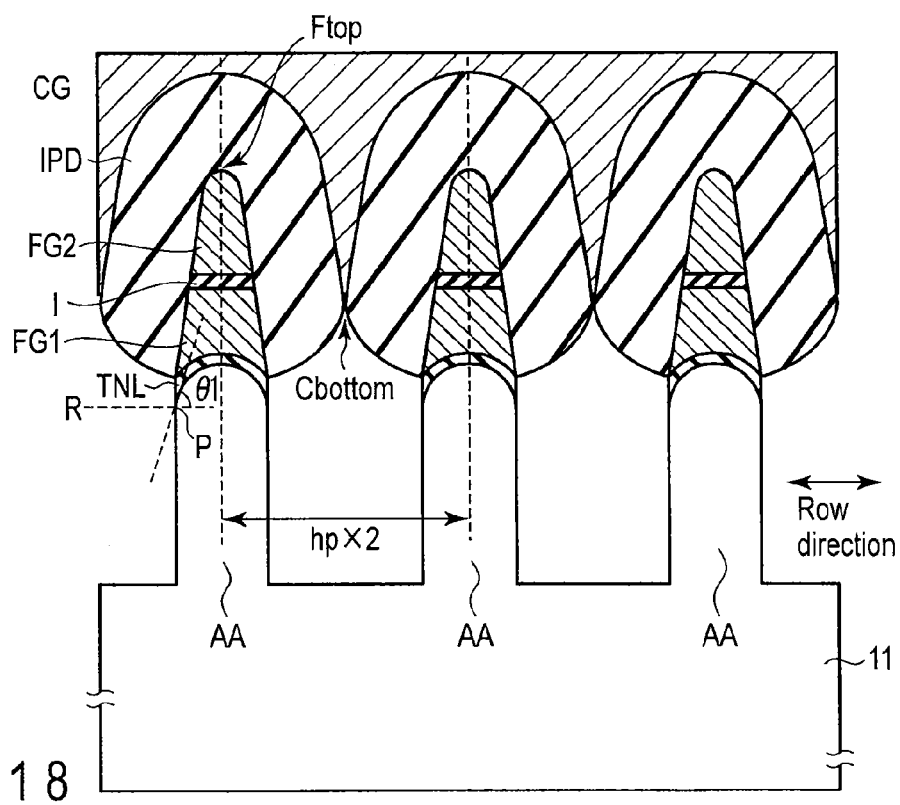

FIG. 18 shows a cell array structure according to a second modification.

FIG. 18 corresponds to the sectional view (FIG. 2) in the row direction according to the first embodiment described above.

The cell array structure according to this example is different from the cell array structure according to the first embodiment described above in that the charge storage layer of the memory cell has a double floating gate type.

That is, the charge storage layer includes a first floating gate electrode FG1 on the gate insulating layer TNL, and a second floating gate electrode FG2 on the first floating gate electrode FG1.

In this example, an ultrathin insulating layer (e.g. an oxide layer or nitride layer of 1 to 2 nm) I is disposed between the first and second floating gate electrodes FG1 and FG2. However, this ultrathin insulating layer I can be omitted. The ultrathin insulating layer I is flat in FIG. 18, but may have a convex curve as the gate insulating layer (tunnel insulating layer) TNL.

The first floating gate electrode FG1 is, for example, a polysilicon layer. The second floating gate electrode FG2 is, for example, a titanium layer, a tungsten layer, a tantalum layer, a titanium nitride layer, a tungsten nitride layer, or a tantalum nitride layer. The first and second floating gate electrodes FG1 and FG2 are not limited to the materials mentioned above, and are respectively made of materials different from each other.

However, the materials different from each other include a case where the first floating gate electrode FG1 includes some or all of the composition that constitutes the second floating gate electrode FG2, and a case where the first and second floating gate electrodes FG1 and FG2 are only different in composition ratio (have the same constituent elements).

In this example as well, it is possible to obtain advantageous effects such as the increase of the coupling ratio, the prevention of the inter-cell interference, and easier adjustment of the coupling ratio.

[Third Modification]

Figure 19:
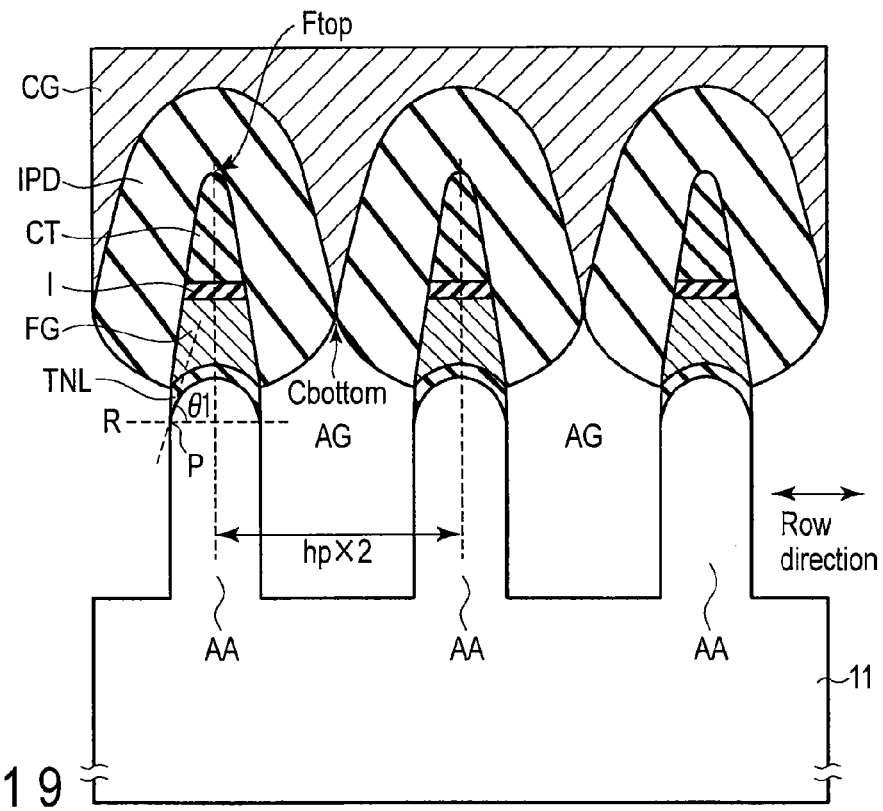

FIG. 19 shows a cell array structure according to a third modification.

FIG. 19 corresponds to the sectional view (FIG. 2) in the row direction according to the first embodiment described above.

The cell array structure according to this example is different from the cell array structure according to the first embodiment described above in that the charge storage layer of the memory cell has a hybrid type.

That is, the charge storage layer includes a floating gate electrode FG as an electrically floating conductive layer, and a charge trap layer CT which is disposed on the floating gate electrode FG and which serves as an insulating layer to trap a charge.

In this example, an ultrathin insulating layer (e.g. an oxide layer or nitride layer of 1 to 2 nm) I is disposed between the floating gate electrode FG and the charge trap layer CT. However, this ultrathin insulating layer I can be omitted. The ultrathin insulating layer I is flat in FIG. 18, but may have a convex curve as the gate insulating layer (tunnel insulating layer) TNL.

The floating gate electrode FG comprises, for example, a polysilicon layer, a metallic layer, or a stack of these layers. The charge trap layer CT comprises an insulating layer such as SiN, SiON, $Al_2O_3$, or HfO.

In this example as well, it is possible to obtain advantageous effects such as the increase of the coupling ratio, the prevention of the inter-cell interference, and easier adjustment of the coupling ratio.

[Fourth Modification]

Figure 20:
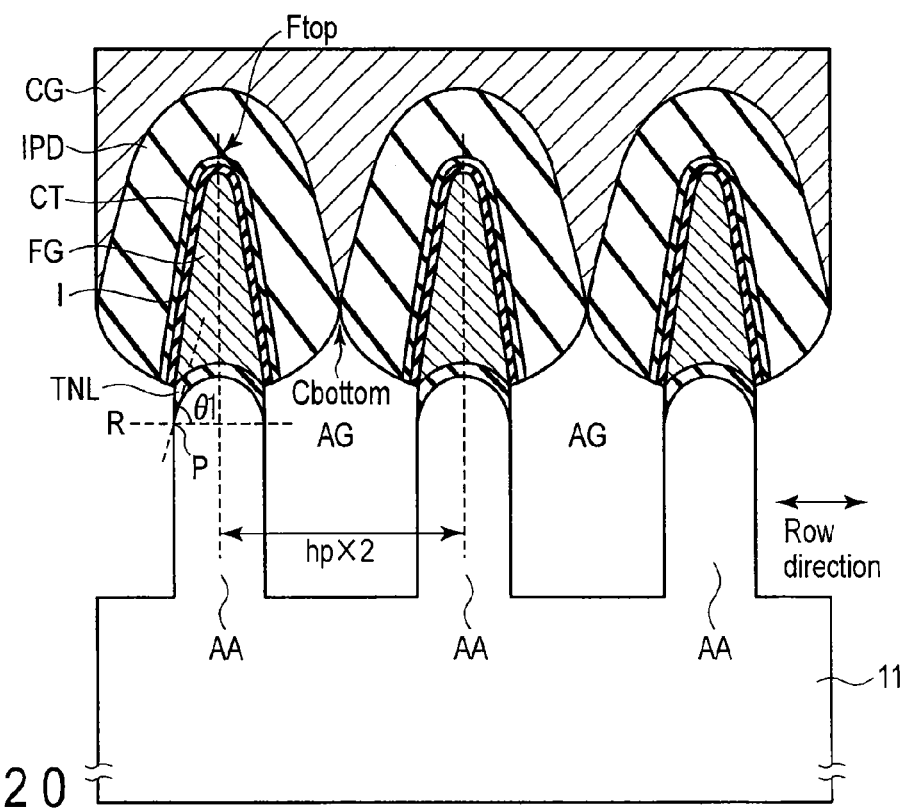

FIG. 20 shows a cell array structure according to a fourth modification.

FIG. 20 corresponds to the sectional view (FIG. 2) in the row direction according to the first embodiment described above.

The cell array structure according to this example concerns the hybrid type as in the third modification described above. That is, the charge storage layer includes a floating gate electrode FG as an electrically floating conductive layer, and a charge trap layer CT which is disposed on the floating gate electrode FG and which serves as an insulating layer to trap a charge.

However, in this example, the charge trap layer CT is formed to cover the entire or substantially the entire upper surface of the floating gate electrode FG.

In this example, an ultrathin insulating layer (e.g. an oxide layer or nitride layer of 1 to 2 nm) I is disposed between the floating gate electrode FG and the charge trap layer CT. However, this ultrathin insulating layer I can be omitted.

The floating gate electrode FG comprises, for example, a polysilicon layer, a metallic layer, or a stack of these layers. The charge trap layer CT comprises an insulating layer such as SiN, SiON, $Al_2O_3$, or HfO.

In this example as well, it is possible to obtain advantageous effects such as the increase of the coupling ratio, the prevention of the inter-cell interference, and easier adjustment of the coupling ratio.

[Additions]

In the first embodiment and first to fourth modifications described above, the inter-electrode insulating layer IPD and the control gate electrode CG may each have a multilayer structure.

Although the inter-electrode insulating layer IPD covers the entire floating gate electrode FG in FIG. 2, the inter-electrode insulating layer IPD may only cover an upper part of the floating gate electrode FG. However, the Ftop needs to be higher than the Cbottom.

While it has been described that the taper angle $\theta 1$ is preferably 30 degrees or more and 60 degrees or less, the taper angle $\theta 1$ is an angle that characterizes the end of the active area AA having a convex curve. For example, the angle $\theta 1$ can be defined as follows.

When the end of the active area AA is a straight line, the angle $\theta 1$ is an angle between the straight line and a reference plane R. When the end of the active area AA is a curve, the angle $\theta 1$ is an angle between a tangent to the curve and the reference plane R. When the curvature of the end of the active area AA changes to a great extent, the angle $\theta 1$ is an angle between a straight line that connects the end of the active area AA covered with the floating gate electrode FG to the end of the upper surface of the active area AA, and the reference plane R.

2. Second Embodiment

[Structure]

Figure 21:
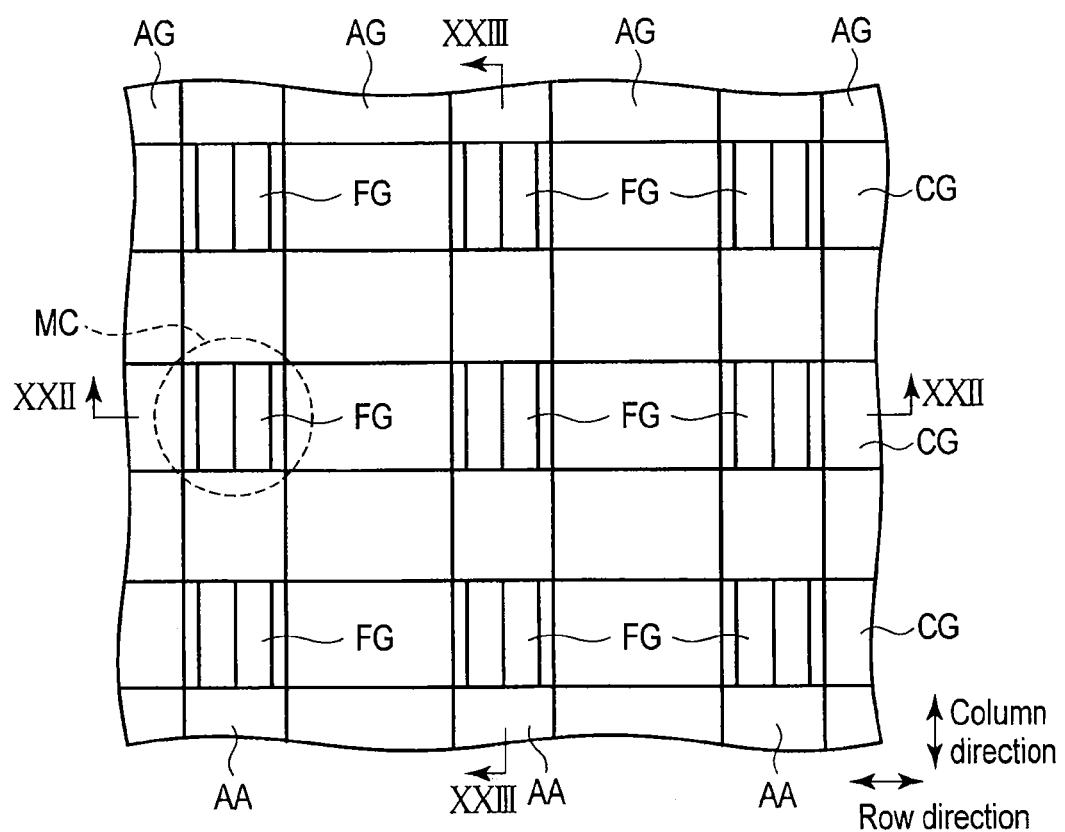
FIG. 21 is a plan view showing a second embodiment of an array structure.

FIG. 21 to FIG. 23 show a second embodiment of an array structure.

FIG. 21 is a plan view of a memory cell array. FIG. 22 is a sectional view taken along the line XXII-XXII in FIG. 21. FIG. 23 is a sectional view taken along the line XXIII-XXIII in FIG. 21.

A semiconductor substrate 11 is, for example, a silicon substrate. The upper surface of the semiconductor substrate 11 is shaped to have depressions and projections. The projections constitute fin type active areas AA. The fin type active areas AA are arranged in a row direction (first direction), and extend in a column direction (second direction) that intersects with the row direction.

In this example, the upper surfaces of the fin type active areas AA (projections) are flat. However, as in the first embodiment described above (e.g. see FIG. 2), the width of the upper surfaces of the fin type active areas AA in the row direction may gradually become smaller upward. That is, in this example as well, the upper surfaces of the fin type active areas AA may have taper shapes (e.g. convex curves).

The upper surface of the semiconductor substrate 11 (the bottom surfaces of the depressions) and the side surfaces of the fin type active areas AA may be covered with an insulating layer. The insulating layer is, for example, an oxide layer formed by the oxidizing of the semiconductor substrate 11. The insulating layer prevents electrons in the fin type active areas (channels) AA from escaping to an air gap AG.

The fin type active areas AA are a part of the semiconductor substrate 11 in this example, but are not limited thereto. For example, the fin type active areas AA may be semiconductor layers such as epitaxial layers on the semiconductor substrate 11.

Memory cells MC are arranged on each of the fin type active areas AA. The memory cells MC on one fin type active area AA are connected in series, for example, in the column direction, and thereby constitute a NAND string.

Each of the memory cells MC includes a gate insulating layer (tunnel insulating layer) TNL on the fin type active area AA, a floating gate electrode FG on the gate insulating layer TNL, an inter-electrode insulating layer IPD on the floating gate electrode FG, and a control gate electrode CG on the inter-electrode insulating layer IPD.

The structure of the memory cell MC is the same as that according to the first embodiment described above, and is therefore not described in detail here. However, regarding the structure of the memory cell, this example is different from the first embodiment in the following.

The thickness of the inter-electrode insulating layer IPD in a direction perpendicular to the upper surface of the floating gate electrode FG gradually becomes smaller as it approaches the semiconductor substrate 11.

The inter-electrode insulating layer IPD satisfies $1.05 \leq T_{max}/T_{min} \leq 1.7$, wherein $T_{min}$ is a minimum value of the thickness of the inter-electrode insulating layer IPD in the direction perpendicular to the upper surface of the floating gate electrode FG, and $T_{max}$ is a maximum value of the thickness of the inter-electrode insulating layer IPD in the direction perpendicular to the upper surface of the floating gate electrode FG.

As a result, a bottom Cbottom of the control gate electrode CG can be located lower than in the first embodiment described above. That is, there is a greater gap between the bottom Cbottom of the control gate electrode CG and a top Ftop of the floating gate electrode FG, so that the area in which the floating gate electrode FG and the control gate electrode CG face each other can be increased.

Consequently, the coupling ratio of the memory cells MC can be further improved.

An angle θ2 between the upper surface of the inter-electrode insulating layer IPD and a reference plane parallel to the surface of the floating gate electrode FG is preferably 0 degrees or more and 20 degrees or less.

This prevents the width of an opening between two inter-electrode insulating layers IPD from being excessively great when two inter-electrode insulating layers IPD of two memory cells adjacent in the row direction are separated from each other. When the width of this opening is excessively great, there is a higher risk that the control gate electrode CG may come onto the semiconductor substrate 11.

As in the flat cell structure, the array structure described above can maintain an advantageous effect of a half pitch hp that is not limited by the inter-electrode insulating layer IPD and the control gate electrode CG. At the same time, the coupling ratio can be improved.

The space between the floating gate electrodes FG is the air gap AG in this example, but can be replaced by an insulating layer (e.g. silicon oxide layer) lower in relative dielectric constant than the inter-electrode insulating layer IPD.

Moreover, a charge storage layer of the memory cell MC is the floating gate electrode FG in this example, but may be replaced by a charge trap layer (insulating layer) having a charge trap function.

The memory cells MC arranged in the column direction do not have any diffusion layers in the fin type active area AA in this example. However, the memory cells MC may otherwise have diffusion layers in the fin type active area AA.

[Manufacturing Method]

A manufacturing method of the cell array structure according to the embodiment is described.

First, as shown in FIG. 24, a gate insulating layer TNL and a floating gate electrode FG are formed on a semiconductor substrate 11. The gate insulating layer TNL is, for example, a silicon oxide layer. The floating gate electrode FG is, for example, a polysilicon layer.

A photoresist layer is then formed on the floating gate electrode FG by a photo engraving process (PEP). The photoresist layer has line-and-space patterns which are arranged with a constant pitch in the row direction and which extend in the column direction.

The photoresist layer is then used as a mask to pattern the floating gate electrode FG by reactive ion etching (RIE). The photoresist layer is then removed, and the floating gate electrode FG is used as a mask to etch the gate insulating layer TNL and the semiconductor substrate 11 by dry etching.

As a result, an active area AA having line-and-space patterns which are arranged with a constant pitch (half pitch hp×2) in the row direction and which extend in the column direction is formed. At the same time, the floating gate electrode FG is partly etched, and the shape of the floating gate electrode FG is tapered upward.

The surface of the semiconductor substrate 11 is then covered with an insulating layer 12. The insulating layer 12 may be a native oxide layer. The surface of the floating gate electrode FG may also be covered by an insulating layer such as a native oxide layer.

Instead of the process described above, the photoresist layer may be used as a mask to sequentially etch the floating gate electrode FG, the gate insulating layer TNL, and the semiconductor substrate 11 by RIE. In this case, after this etching, the floating gate electrode FG is etched into a taper shape.

As shown in FIG. 25, an inter-electrode insulating layer IPD is formed on the upper surface of the floating gate electrode FG. The inter-electrode insulating layer IPD is only formed on the upper surface of the floating gate electrode FG by the use of a deposition method such as the sputtering method or the CVD method that deteriorates the coverage.

In this example, during the formation of the inter-electrode insulating layer IPD, the inter-electrode insulating layer IPD is slowly formed by a temperature lower than formation temperatures in normal sputtering methods and CVD methods.

In this case, a formation material as the inter-electrode insulating layer IPD starts adhering at the top Ftop of the floating gate electrode FG. Therefore, the thickness of the inter-electrode insulating layer IPD in a direction perpendicular to the upper surface of the floating gate electrode FG gradually becomes smaller as it approaches the semiconductor substrate 11.

In this example, the inter-electrode insulating layer IPD may be formed by two deposition processes and one thermal treatment, as in the first embodiment described above. That is, in this example as well, the inter-electrode insulating layer IPD may be formed by the steps in FIG. 12 to FIG. 14.

Finally, as shown in FIG. 26, a control gate electrode CG is formed on the inter-electrode insulating layer IPD. The manufacturing process of the control gate electrode CG is the same as that according to the first embodiment described above, and is therefore not described here.

The cell array structure according to the second embodiment is completed by the manufacturing method described above.

[First Modification]

FIG. 27 shows a cell array structure according to a first modification.

FIG. 27 corresponds to the sectional view (FIG. 22) in the row direction according to the second embodiment described above.

The cell array structure according to this example is different from the cell array structure according to the second embodiment described above in that an opening is formed between two inter-electrode insulating layers IPD of two memory cells adjacent in the row direction so that these inter-electrode insulating layers IPD are separated from each other.

As the control gate electrode CG is formed by a deposition method such as a sputtering method or a CVD method that deteriorates the coverage, the control gate electrode CG is not formed on the semiconductor substrate 11 through the opening between two inter-electrode insulating layers IPD.

In this example as well, the bottom Cbottom of the control gate electrode CG is lower than the top Ftop of the floating gate electrode FG. The thickness of the inter-electrode insulating layer IPD in a direction perpendicular to the upper surface of the floating gate electrode FG gradually becomes smaller as it approaches the semiconductor substrate 11 (T1>T2).

In this example as well, it is possible to obtain advantageous effects such as the increase of the coupling ratio and the prevention of the inter-cell interference.

[Second Modification]

FIG. 28 shows a cell array structure according to a second modification.

FIG. 18 corresponds to the sectional view (FIG. 22) in the row direction according to the second embodiment described above.

The cell array structure according to this example is different from the cell array structure according to the second embodiment described above in that the charge storage layer of the memory cell has a double floating gate type.

That is, the charge storage layer includes a first floating gate electrode FG1 on the gate insulating layer TNL, and a second floating gate electrode FG2 on the first floating gate electrode FG1.

In this example, an ultrathin insulating layer (e.g. an oxide layer or nitride layer of 1 to 2 nm) I is disposed between the first and second floating gate electrodes FG1 and FG2. However, this ultrathin insulating layer I can be omitted.

The first floating gate electrode FG1 is, for example, a polysilicon layer. The second floating gate electrode FG2 is, for example, a titanium layer, a tungsten layer, a tantalum layer, a titanium nitride layer, a tungsten nitride layer, or a tantalum nitride layer. The first and second floating gate electrodes FG1 and FG2 are not limited to the materials mentioned above, and are respectively made of materials different from each other.

In this example as well, it is possible to obtain advantageous effects such as the increase of the coupling ratio, the prevention of the inter-cell interference, and easier adjustment of the coupling ratio.

[Third Modification]

FIG. 29 shows a cell array structure according to a third modification.

FIG. 29 corresponds to the sectional view (FIG. 22) in the row direction according to the second embodiment described above.

The cell array structure according to this example is different from the cell array structure according to the second embodiment described above in that the charge storage layer of the memory cell has a hybrid type.

That is, the charge storage layer includes a floating gate electrode FG as an electrically floating conductive layer, and a charge trap layer CT which is disposed on the floating gate electrode FG and which serves as an insulating layer to trap a charge.

In this example, an ultrathin insulating layer (e.g. an oxide layer or nitride layer of 1 to 2 nm) I is disposed between the floating gate electrode FG and the charge trap layer CT. However, this ultrathin insulating layer I can be omitted.

The floating gate electrode FG comprises, for example, a polysilicon layer, a metallic layer, or a stack of these layers. The charge trap layer CT comprises an insulating layer such as SiN, SiON, $Al_2O_3$, or HfO.

In this example as well, it is possible to obtain advantageous effects such as the increase of the coupling ratio, the prevention of the inter-cell interference, and easier adjustment of the coupling ratio.

[Fourth Modification]

FIG. 30 shows a cell array structure according to a fourth modification.

FIG. 30 corresponds to the sectional view (FIG. 2) in the row direction according to the second embodiment described above.

The cell array structure according to this example concerns the hybrid type as in the third modification described above. That is, the charge storage layer includes a floating gate electrode FG as an electrically floating conductive layer, and a charge trap layer CT which is disposed on the floating gate electrode FG and which serves as an insulating layer to trap a charge.

However, in this example, the charge trap layer CT is formed to cover the entire or substantially the entire upper surface of the floating gate electrode FG.

In this example, an ultrathin insulating layer (e.g. an oxide layer or nitride layer of 1 to 2 nm) I is disposed between the floating gate electrode FG and the charge trap layer CT. However, this ultrathin insulating layer I can be omitted.

The floating gate electrode FG comprises, for example, a polysilicon layer, a metallic layer, or a stack of these layers. The charge trap layer CT comprises an insulating layer such as SiN, SiON, $Al_2O_3$, or HfO.

In this example as well, it is possible to obtain advantageous effects such as the increase of the coupling ratio, the prevention of the inter-cell interference, and easier adjustment of the coupling ratio.

[Additions]

In the second embodiment and first to fourth modifications described above, the inter-electrode insulating layer IPD and the control gate electrode CG may each have a multilayer structure.

Although the inter-electrode insulating layer IPD covers the entire floating gate electrode FG in FIG. 22, the inter-electrode insulating layer IPD may only cover an upper part of the floating gate electrode FG. However, the Ftop needs to be higher than the Cbottom.

The floating gate electrode FG is in a triangular shape in FIG. 22, but may be in other shapes as long as it is in a taper shape that becomes narrower in width upward.

While it has been described that the maximum value Tmax and minimum value Tmin of the thickness of the inter-electrode insulating layer IPD are preferably 1.05<Tmax/Tmin<1.7, Tmin is a perpendicular distance from the upper surface of the floating gate electrode FG to the part where two inter-electrode insulating layers IPD contact each other. When two inter-electrode insulating layers IPD are in line contact (finite width), Tmin is a perpendicular distance from the upper surface of the floating gate electrode FG to the top of the part where two inter-electrode insulating layers IPD contact each other.

As shown in FIG. 27, when the inter-electrode insulating layers IPD have no contact point, Tmin is a perpendicular distance from the upper surface of the floating gate electrode FG to the point where two inter-electrode insulating layers IPD are closest to each other. Tmax is a perpendicular height of the inter-electrode insulating layer IPD at the upper end of the floating gate electrode FG.

It has been described that the angle θ2 between the upper surface of the inter-electrode insulating layer IPD and the reference plane parallel to the upper surface of the floating gate electrode FG is preferably 0 degrees or more and 20 degrees or less. The angle θ2 represents an angular difference between the side surface of the floating gate electrode FG and the side surface of the inter-electrode insulating layer IPD.

As shown in FIG. 22, if both the side surface of the floating gate electrode FG and the side surface of the inter-electrode insulating layer IPD are straight lines, the angle θ2 is an angular difference between the two straight lines. When both the side surface of the floating gate electrode FG and the side surface of the inter-electrode insulating layer IPD are curved surfaces, the angle θ2 is an angular difference between a tangent to the side surface of the inter-electrode insulating layer IPD at the lowermost point (Cbottom in FIG. 22) where the control gate electrode CG and the inter-electrode insulating layer IPD contact each other, and a tangent on the side surface (point) of the floating gate electrode FG closest to the lowermost point where the control gate electrode CG and the inter-electrode insulating layer IPD contact each other.

3. Conclusion

As described above, according to the first and second embodiments, it is possible to obtain advantageous effects such as the increase of the coupling ratio, the prevention of the inter-cell interference, and easier adjustment of the coupling ratio.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a semiconductor substrate;
   an active area on the semiconductor substrate, the active area having an upper surface with a first taper shape, having a width in a first direction, and extending in a second direction which intersects with the first direction;
   a first insulating layer on the upper surface of the active area;
   a charge storage layer on the first insulating layer, the charge storage layer having an upper surface with a second taper shape;
   a second insulating layer covering the upper surface of the charge storage layer, the second insulating layer having an upper surface with a third taper shape and an lower surface with a fourth taper shape downward bulged, the third taper shape and the fourth taper shape meeting at side boundaries, the side boundaries being located farthest from a center of the active area in the first direction; and
   a control gate electrode on the upper surface of the second insulating layer, the control gate electrode extending in the first direction.

2. The device of claim 1, wherein a bottom of the control gate electrode is lower than a top of the charge storage layer.

3. The device of claim 1, wherein the upper surface of the active area and an upper surface of the first insulating layer have a convex curve.

4. The device of claim 3, wherein the substrate has a surface, and an angle between the upper surface of the active area and a reference plane parallel to the surface of the semiconductor substrate is 30 degrees or more and 60 degree or less.

5. The device of claim 1, wherein the charge storage layer comprises first and second floating gate electrodes.

6. The device of claim 5, wherein the charge storage layer comprises an insulating layer between the first and second floating gate electrode.

7. The device of claim 1, wherein the charge storage layer comprises a floating gate electrode and a charge trap layer.

8. The device of claim 7, wherein the charge storage layer comprises an insulating layer between the floating gate electrode and the charge trap layer.

9. The device of claim 7, wherein the charge trap layer is disposed on the floating gate electrode.

10. The device according to claim 7, wherein the charge trap layer covers an upper surface of the floating gate electrode.

11. A nonvolatile semiconductor memory device comprising:
- a semiconductor substrate;
- an active area on the semiconductor substrate, the active area having a width in a first direction, and extending in a second direction intersect with the first direction
- a first insulating layer on the active area;
- a charge storage layer on the first insulating layer, the charge storage layer having an upper surface with a first taper shape;
- a second insulating layer covering the upper surface of the charge storage layer, the second insulating layer having an upper surface of a second taper shape and an lower surface with a third taper shape downward bulged, the second taper shape and the third taper shape meeting at side boundaries, the side boundaries being located farthest from a center of the active area in the first direction and having a thickness in a direction perpendicular to the upper surface of the charge storage layer, the thickness becoming smaller with approaching the semiconductor substrate; and
- a control gate electrode on the upper surface of the second insulating layer, the control gate electrode extending in the first direction.

12. The device according to claim 11, wherein the second insulating layer has an upper surface, and an angle between the upper surface of the second insulating layer and a reference plane parallel to the upper surface of the charge storage layer is larger than 0 degree and equal to or less than 20 degree.

13. The device of claim 11, wherein the second insulating layer satisfies $1.05 \leq T_{max}/T_{min} \leq 1.7$,
wherein $T_{min}$ is a minimum value of a thickness of the second insulating layer in the direction, and $T_{max}$ is a maximum value of the thickness of the second insulting layer in the direction.

14. The device of claim 11, wherein a bottom of the control gate electrode is lower than a top of the charge storage layer.

15. The device of claim 11, wherein the charge storage layer comprises first and second floating gate electrodes.

16. The device of claim 15, wherein the charge storage layer comprises an insulating layer between the first and second floating gate electrodes.

17. The device of claim 11, wherein the charge storage layer comprises a floating gate electrode and a charge trap layer.

18. The device of claim 17, wherein the charge storage layer comprises an insulating layer between the floating gate electrode and the charge trap layer.

19. The device of claim 17, wherein the charge trap layer is disposed on the floating gate electrode.

20. The device according to claim 17, wherein the charge trap layer covers an upper surface of the floating gate electrode.

* * * * *